(12) United States Patent
Nishitani et al.

(10) Patent No.: US 12,441,833 B2
(45) Date of Patent: Oct. 14, 2025

(54) COMPOSITION FOR CURABLE RESIN, CURED PRODUCT OF SAID COMPOSITION, PRODUCTION METHOD FOR SAID COMPOSITION AND SAID CURED PRODUCT, AND SEMICONDUCTOR DEVICE

(71) Applicant: ENEOS Corporation, Tokyo (JP)

(72) Inventors: Yoshinori Nishitani, Tokyo (JP); Tatsuki Sato, Tokyo (JP); Masaki Minami, Tokyo (JP)

(73) Assignee: ENEOS Corporation, Tokyo (JP)

( * ) Notice: Subject to any disclaimer, the term of this patent is extended or adjusted under 35 U.S.C. 154(b) by 838 days.

(21) Appl. No.: 17/311,659

(22) PCT Filed: Dec. 10, 2019

(86) PCT No.: PCT/JP2019/048200
§ 371 (c)(1),
(2) Date: Jun. 7, 2021

(87) PCT Pub. No.: WO2020/122045
PCT Pub. Date: Jun. 18, 2020

(65) Prior Publication Data
US 2022/0106437 A1    Apr. 7, 2022

(30) Foreign Application Priority Data
Dec. 10, 2018 (JP) .................. 2018-231150

(51) Int. Cl.
C08G 59/62 (2006.01)
C08J 5/24 (2006.01)
(Continued)

(52) U.S. Cl.
CPC ............ *C08G 59/621* (2013.01); *C08K 3/36* (2013.01); *H01L 23/293* (2013.01); *H01L 23/295* (2013.01)

(58) Field of Classification Search
None
See application file for complete search history.

(56) References Cited

U.S. PATENT DOCUMENTS

| 4,395,574 A | 7/1983 | Doorakian et al. |
| 10,047,222 B2 | 8/2018 | Hu et al. |
| (Continued) | | |

FOREIGN PATENT DOCUMENTS

| EP | 0019852 A1 | 12/1980 |
| EP | 3553129 A1 | 10/2019 |
| (Continued) | | |

OTHER PUBLICATIONS

Japan Society of Epoxy Resin Technology (Ed.), "Outline: Epoxy resin, Basic part I," pp. 163-164, 303-304 (Nov. 19, 2003).
(Continued)

*Primary Examiner* — Ha S Nguyen
(74) *Attorney, Agent, or Firm* — Leydig, Voit & Mayer, Ltd.

(57) ABSTRACT

The invention provides a curable resin composition excellent in curability at low temperature for obtaining a cured product high in heat resistance, a cured product thereof, and methods of producing the curable resin composition and the cured product. Also provided is a semiconductor device using the cured product as a sealant. In particular, the invention provides a curable resin composition comprising (A) a benzoxazine compound represented by a structure of formula (1), (B) an epoxy compound, and (C) a phenol-based curing agent, wherein a number of epoxy groups in the epoxy compound (B), a number of benzoxazine rings in the benzoxazine compound (A), and a number of hydroxyl groups in the phenol-based curing agent (C) satisfy formula (2), and a ratio of the benzoxazine equivalent in the benzo-
(Continued)

REACTION PEAK TEMPERATURE xazine compound (A) to the hydroxyl group equivalent in the phenol-based curing agent (C) is 1.1 to 8.0.

20 Claims, 1 Drawing Sheet

(51) Int. Cl.

| | | |
|---|---|---|
| C08K 3/36 | (2006.01) | |
| C08K 5/357 | (2006.01) | |
| C08L 63/00 | (2006.01) | |
| C08L 79/04 | (2006.01) | |
| H01L 23/29 | (2006.01) | |
| H01L 23/31 | (2006.01) | |

(56) References Cited

U.S. PATENT DOCUMENTS

| | | | |
|---|---|---|---|
| 11,578,166 B2 | 2/2023 | Nishitani et al. | |
| 11,584,824 B2 | 2/2023 | Nishitani et al. | |
| 2004/0217376 A1 | 11/2004 | Ahsan et al. | |
| 2010/0249276 A1 | 9/2010 | Dershem | |
| 2014/0212658 A1 | 7/2014 | Fukuda et al. | |
| 2015/0141583 A1 | 5/2015 | Arai et al. | |
| 2016/0222204 A1* | 8/2016 | Wang | C08G 59/56 |
| 2017/0327683 A1* | 11/2017 | Hu | H05K 1/0353 |
| 2018/0086911 A1 | 3/2018 | Yao et al. | |
| 2019/0119447 A1 | 4/2019 | Minami et al. | |
| 2020/0095422 A1* | 3/2020 | Nishitani | C08G 59/24 |

FOREIGN PATENT DOCUMENTS

| | | |
|---|---|---|
| JP | S55-157594 A | 12/1980 |
| JP | H09-048839 A | 2/1997 |
| JP | H11-130937 A | 5/1999 |
| JP | 2002-053643 A | 2/2002 |
| JP | 2005-272722 A | 10/2005 |
| JP | 2010-254895 A | 11/2010 |
| JP | 2012-036318 A | 2/2012 |
| JP | 2013-060407 A | 4/2013 |
| JP | 2016-169362 A | 9/2016 |
| JP | 2017-020011 A | 1/2017 |
| JP | 2017-045891 A | 3/2017 |
| JP | 2017-165922 A | 9/2017 |
| JP | 2018-188611 A | 11/2018 |
| JP | 2018184533 A * | 11/2018 |
| KR | 10-2014-0081817 A1 | 7/2014 |
| TW | 201516087 A | 5/2015 |
| TW | 201739829 A | 11/2017 |
| TW | 201835140 A | 10/2018 |
| WO | WO 2015/002071 A1 | 1/2015 |
| WO | WO 2017/015376 A1 | 1/2017 |
| WO | WO 2017/188448 A1 | 11/2017 |
| WO | WO-2018105743 A1 * | 6/2018 ............ C08G 59/24 |
| WO | WO 2018/181857 A1 | 10/2018 |
| WO | WO 2019/083002 A1 | 5/2019 |
| WO | WO 2019/083004 A1 | 5/2019 |

OTHER PUBLICATIONS

Huntsman, "Tactix 742 Solid Trifunctional Epoxy Resin," Technical Data Sheet (Oct. 2012).
European Patent Office, Extended European Search Report in European Patent Application No. 18869515.9 (Mar. 31, 2021).
Japan Patent Office, International Search Report in International Patent Application No. PCT/JP2018/039821 (Jan. 15, 2019).
Japan Patent Office, International Search Report for International Patent Application PCT/JP2020/017580 (Jul. 14, 2020).
Japan Patent Office, International Preliminary Report on Patentability in International Patent Application No. PCT/JP2020/017580 (Sep. 28, 2021).
Korean Intellectual Property Office, Notification of Reason for Refusal in Korean Patent Application No. 10-2020-7011955 (Dec. 21, 2021).
Taiwan Patent Office, Office Action in Taiwanese Patent Application No. 107137937 (Feb. 23, 2022).
The International Bureau of WIPO, International Preliminary Report on Patentability in International Patent Application No. PCT/JP2018/039821 (Apr. 28, 2020).
Japan Patent Office, Office Action in Japanese Patent Application No. 2020-559240 (Aug. 4, 2023).
Taiwan Intellectual Property Office, Office Action in Taiwanese Patent Application No. 108145169 (Jun. 28, 2023).
U.S. Appl. No. 16/759,688, filed Apr. 27, 2020.
U.S. Appl. No. 16/759,704, filed Apr. 27, 2020.
U.S. Appl. No. 16/759,677, filed Apr. 27, 2020.
U.S. Appl. No. 17/606,681, filed Oct. 26, 2021.
China National Intellectual Property Administration, Office Action in Chinese Patent Application No. 201980076469.4 (Oct. 9, 2023).
Taiwan Intellectual Property Office, Office Action in Taiwanese Patent Application No. 108145169 (Nov. 13, 2023).
China National Intellectual Property Administration, Office Action in Chinese Patent Application No. 201980076469.4 (Mar. 25, 2023).
Japanese Patent Office, International Search Report in International Patent Application No. PCT/JP2019/048200 (Mar. 10, 2020).
Japanese Patent Office, International Preliminary Report on Patentability in International Patent Application No. PCT/JP2019/048200 (Jun. 8, 2021).
Korean Intellectual Property Office, Office Action in Korean Patent Application No. 10-2021-7019716 (Aug. 5, 2024).
Taiwan Intellectual Property Office, Office Action in Taiwanese Patent Application No. 108145169 (Jan. 16, 2025).
Korean Intellectual Property Office, Office Action in Korean Patent Application No. 10-2021-7019716 (Mar. 28, 2025).

* cited by examiner

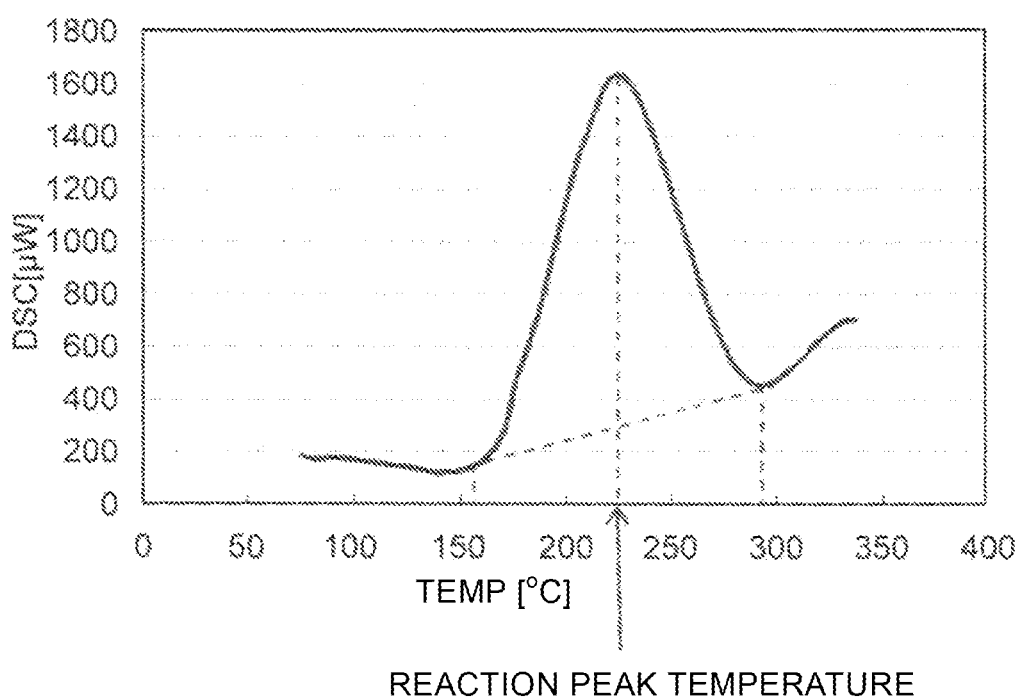
REACTION PEAK TEMPERATURE

COMPOSITION FOR CURABLE RESIN, CURED PRODUCT OF SAID COMPOSITION, PRODUCTION METHOD FOR SAID COMPOSITION AND SAID CURED PRODUCT, AND SEMICONDUCTOR DEVICE

CROSS-REFERENCE TO RELATED APPLICATIONS

This application is the U.S. national phase of International Patent Application No. PCT/JP2019/048200, filed on Dec. 10, 2019, which claims the benefit of Japanese Patent Application No. 2018-231150, filed on Dec. 10, 2018; both of which are incorporated herein by reference in their entireties.

TECHNICAL FIELD

The present invention relates to a curable resin composition for obtaining a cured product high in heat resistance, a cured product thereof, and methods of producing the curable resin composition and the cured product.

Furthermore, the present invention relates to a semiconductor device using the cured product as a sealant.

BACKGROUND ART

Curable resins are used in various applications of semiconductor sealants, fiber reinforced plastics, and the like, and benzoxazine compounds are used for one of raw materials of such resins.

Benzoxazine compounds refer to compounds each including a benzoxazine ring having a benzene backbone and an oxazine backbone, and benzoxazine resins as cured products (polymerized products) thereof are excellent in physical properties such as heat resistance and mechanical strength, and are used as high-performance materials in various applications.

Patent Literature 1 discloses a novel benzoxazine compound having a specified structure, and a production method thereof, and describes the benzoxazine compound which has a high thermal conductivity and which enables a benzoxazine resin cured product having a high thermal conductivity to be produced.

Patent Literature 2 discloses a thermosetting resin where a reactive end of a polybenzoxazine resin having a specified benzoxazine ring structure in a main chain is partially or fully closed, and describes the thermosetting resin which is excellent in storage stability in the case of being dissolved in a solvent.

RELATED ART DOCUMENTS

Patent Literature

[Patent Literature 1] JP 2013-60407 A
[Patent Literature 2] JP 2012-36318 A

SUMMARY OF THE INVENTION

Problems to be Solved by the Invention

There is still a need for a resin cured product that is high in heat resistance so as to be adapted for more stringent usage conditions, in applications of, for example, matrix resins for adhesives, sealants, paints, and composites. There is also a need for a curable resin composition excellent in curability at low temperature to enhance productivity.

However, there has not been obtained any curable resin composition excellent in curability at low temperature for obtaining a cured product high in heat resistance.

Accordingly, an object of the present invention is to provide a curable resin composition excellent in curability at low temperature for obtaining a cured product high in heat resistance. Another object of the present invention is to provide a cured product obtained by curing the curable resin composition, and methods of producing the curable resin composition and the cured product. Another object of the present invention is to provide a semiconductor device using the cured product as a sealant.

Means for Solving the Problems

The present inventors have made intensive studies in order to achieve the above objects, and as a result, have developed a curable resin composition containing a specific multifunctional benzoxazine compound, epoxy compound, and phenol-based curing agent at a specific ratio, and have found that the curable resin composition is excellent in curability at low temperature and that a cured product of the composition is excellent in heat resistance, thereby leading to completion of the present invention.

That is, the present invention is as follows.

[1] A curable resin composition containing:
  (A) a benzoxazine compound represented by a structure of formula (1),
  (B) an epoxy compound, and
  (C) a phenol-based curing agent,
wherein
  a number of epoxy groups in the epoxy compound (B), a number of benzoxazine rings in the benzoxazine compound (A), and a number of hydroxyl groups in the phenol-based curing agent (C) satisfy the following formula (2), and
  a ratio of the number of benzoxazine rings in the benzoxazine compound (A) to the number of hydroxyl groups in the phenol-based curing agent (C) is 1.1 to 8.0:

[Chem. 1]

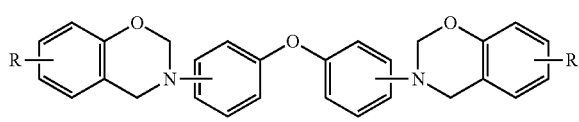

(1)

wherein in the formula (1), each R independently represents hydrogen, a linear alkyl group having 1 to 12 carbon atoms, a cyclic alkyl group having 3 to 8 carbon atoms, or an aryl group having 6 to 14 carbon atoms, where the aryl group optionally has halogen or a linear alkyl group having 1 to 12 carbon atoms, as a substituent; each R may be independently bound to any position of the benzoxazine ring; and each benzoxazine ring may be independently bound to any position of the benzene ring.

[Math. 1]

Number of epoxy groups/(Number of benzoxazine rings+Number of hydroxyl groups)=0.5 to 1.8  (2)

[2] The curable resin composition according to [1], wherein the epoxy compound (B) is at least one selected from the group consisting of an epoxy compound having at least one norbornane structure and at least two epoxy groups, a biphenyl type epoxy compound, a trisphenolmethane type epoxy compound, a naphthalene type epoxy compound, a novolac type epoxy compound, a phenol aralkyl type epoxy compound, and an epoxy compound having a cyclohexene oxide group.
[3] The curable resin composition according to [1] or [2], further containing (D) a curing accelerator.
[4] The curable resin composition according to any one of [1] to [3], further containing (E) an inorganic filler.
[5] A cured product obtained by curing the curable resin composition according to any one of [1] to [4].
[6] A semiconductor device, wherein a semiconductor element is disposed in a cured product obtained by curing the curable resin composition according to any one of [1] to [4].
[7] A method of producing the curable resin composition according to any one of [1] to [4], the method comprising the steps of:
mixing
  (A) a benzoxazine compound represented by a structure of formula (1),
  (B) an epoxy compound, and
  (C) a phenol-based curing agent, to obtain a mixture; and
processing the mixture into a powdery, pelletized, or granular curable resin composition:

[Chem. 2]

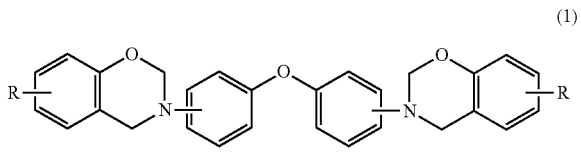

(1)

wherein in the formula (1), each R independently represents hydrogen, a linear alkyl group having 1 to 12 carbon atoms, a cyclic alkyl group having 3 to 8 carbon atoms, or an aryl group having 6 to 14 carbon atoms, where the aryl group optionally has halogen or a linear alkyl group having 1 to 12 carbon atoms, as a substituent; each R may be independently bound to any position of the benzoxazine ring; and each benzoxazine ring may be independently bound to any position of the benzene ring.
[8] The production method according to [7], wherein the epoxy compound (B) is at least one selected from the group consisting of an epoxy compound having at least one norbornane structure and at least two epoxy groups, a biphenyl type epoxy compound, a trisphenolmethane type epoxy compound, a naphthalene type epoxy compound, a novolac type epoxy compound, a phenol aralkyl type epoxy compound, and an epoxy compound having a cyclohexene oxide group.
[9] The production method according to [7] or [8], wherein the step of obtaining a mixture includes further mixing (D) a curing accelerator and/or (E) an inorganic filler to obtain the mixture.

[10] A method of producing a cured product, the method comprising
a step of heating the curable resin composition produced by the method according to any one of [7] to [9], at 150 to 300° C. for 20 seconds to 4 hours, for curing.

Effects of the Invention

The curable resin composition of the present invention is a novel curable resin composition containing components (A) to (C) at a specific ratio, and further, if desired, components (D) and (E), the composition is excellent in curability at low temperature, and a cured product of the composition is characterized by being high in glass transition temperature and being excellent in heat resistance. Accordingly, the curable resin composition of the present invention can be used in an application where heat resistance as well as curability at low temperature are required, for example, applications of matrix resins for adhesives, sealants, paints, and composites. In particular, the curable resin composition not only can allow a semiconductor element sealant to exert excellent sealing performance, but also can contribute to high reliability of a semiconductor device.

The method of producing a cured product of the present invention can form a cured product that has excellent performances described above and that is applicable to the above applications, in a short time.

BRIEF DESCRIPTION OF THE DRAWING

FIG. 1 is a chart showing the reaction peak temperature in a measured result of typical differential scanning calorimetry (DSC).

MODE FOR CARRYING OUT THE INVENTION

[Curable Resin Composition]
Hereinafter, the present invention will be described in detail. It is noted that each "compound" in components (A) to (C) in the present invention encompasses not only a monomer represented by each formula, but also an oligomer obtained by polymerization of the monomer, for example, an oligomer obtained by polymerization of a small amount of the monomer, namely, a prepolymer before formation of a curable resin. Therefore, the curable resin composition of the present invention may be a curing resin composition.
(Component A)
The component (A) that constitutes the curable resin composition is a benzoxazine compound represented by a structure of formula (1). Each R in formula (1) independently represents hydrogen, a linear alkyl group having 1 to 12 carbon atoms, a cyclic alkyl group having 3 to 8 carbon atoms, or an aryl group having 6 to 14 carbon atoms, where the aryl group optionally has halogen or a linear alkyl group having 1 to 12 carbon atoms, as a substituent. Each R may be independently bound to any position of the benzoxazine ring. Each benzoxazine ring may be independently bound to any position of the benzene ring.

Specific examples of R in formula (1) can include, in addition to hydrogen, the following groups.
Examples of the linear alkyl group having 1 to 12 carbon atoms include a methyl group, an ethyl group, a propyl group, an isopropyl group, an n-butyl group, an isobutyl group, and a t-butyl group.
Examples of the cyclic alkyl group having 3 to 8 carbon atoms include a cyclopentyl group and a cyclohexyl group.

Examples of the aryl group having 6 to 14 carbon atoms include a phenyl group, a 1-naphthyl group, a 2-naphthyl group, a phenanthryl group, and a biphenyl group.

The aryl group having 6 to 14 carbon atoms is optionally substituted, and examples of the substituent include a linear alkyl group having 1 to 12 carbon atoms, or halogen. Examples of the aryl group having 6 to 14 carbon atoms, substituted with a linear alkyl group having 1 to 12 carbon atoms or halogen, include an o-tolyl group, a m-tolyl group, a p-tolyl group, a xylyl group, an o-ethylphenyl group, a m-ethylphenyl group, a p-ethylphenyl group, an o-t-butylphenyl group, a m-t-butylphenyl group, a p-t-butylphenyl group, an o-chlorophenyl group, and an o-bromophenyl group.

R is preferably selected from hydrogen, a methyl group, an ethyl group, a propyl group, a phenyl group, and a p-tolyl group, from the viewpoint of favorable handleability.

The benzoxazine compound in formula (1) may be a symmetric benzoxazine compound or an asymmetric benzoxazine compound.

The symmetric benzoxazine compound herein means a benzoxazine compound having symmetry in the molecular structure. The benzoxazine compound having symmetry in the molecular structure means a benzoxazine compound in which the same atom exists in the opposite direction and at the same distance from the molecular center (center of symmetry) of the benzoxazine compound. Specifically, in formula (1), the symmetric benzoxazine compound refers to a benzoxazine compound in which, with the oxygen atom bonding to the two benzene rings at the center, R is the same, the binding position of R to the benzoxazine ring is the same, and the binding position of the benzoxazine ring to the benzene ring is also the same. The symmetric benzoxazine compound is not particularly limited, and examples thereof include 3-[4-[4-(2,4-dihydro-1,3-benzoxazin-3-yl)phenoxy]phenyl]-2,4-dihydro-1,3-benzoxazine), and the like.

The asymmetric benzoxazine compound herein means a benzoxazine compound not having symmetry in the molecular structure. The benzoxazine compound not having symmetry in the molecular structure means a benzoxazine compound in which the same atom does not exist in the opposite direction and at the same distance from the molecular center (center of symmetry) of the benzoxazine compound. Specifically, in formula (1), the asymmetric benzoxazine compound refers to a benzoxazine compound in which, with the oxygen atom bonding to the two benzene rings at the center, at least one of the following is different: R, the binding position of R to the benzoxazine ring, and the binding position of the benzoxazine ring to the benzene ring.

The asymmetric benzoxazine compound is not particularly limited, but is preferably a compound represented by formula (1-1), for example:

[Chem. 3]

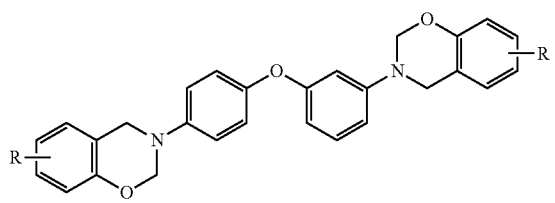

(1-1)

wherein in the formula (1-1), R has the same meaning as R in formula (1).

The asymmetric benzoxazine compound is more preferably 3-[3-[4-(2H-1,3-benzoxazin-3(4H)-yl)phenoxy]phenyl]-3,4-dihydro-2H-1,3-benzoxazine (hereinafter, also referred to as 3,4'-APE-BOZ). 3,4'-APE-BOZ can be produced according to the description of Synthesis Example 1 of JP 2018-184533 A.

The component (A) may also be a mixture of a plurality of kinds of compounds represented in formula (1), which are different from each other in at least one of the following: R, the binding position of R to the benzoxazine ring, and the binding position of the benzoxazine ring to the benzene ring.

The benzoxazine equivalent of the component (A), the benzoxazine compound, is preferably 50 g/eq or more and 600 g/eq or less, more preferably 80 g/eq or more and 400 g/eq or less, in terms of improving reactivity. The benzoxazine equivalent of the component (A), the benzoxazine compound, means herein the equivalent when the benzoxazine ring of the component (A), the benzoxazine compound, is monofunctional.

The number of benzoxazine rings (mol) of the component (A), the benzoxazine compound, is calculated from the benzoxazine equivalent of the component (A), the benzoxazine compound. In the case where the composition of the present invention contains in the component (A) a plurality of kinds of the benzoxazine compounds represented in formula (1), the number of benzoxazine rings is the total number of the rings calculated from the benzoxazine equivalents of such compounds.

(Component B)

The component (B) that constitutes the curable resin composition is an epoxy compound. Such epoxy compound is not particularly limited, without departing from the gist of the present invention, and examples thereof include an epoxy compound having at least one norbornane structure and at least two epoxy groups, a biphenyl type epoxy compound, a trisphenolmethane type epoxy compound, a naphthalene type epoxy compound, a novolac type epoxy compound, a phenol aralkyl type epoxy compound, an epoxy compound having a cyclohexene oxide group, and the like. Such epoxy compound is preferably an epoxy compound having at least one norbornane structure and at least two epoxy groups, a biphenyl type epoxy compound, a trisphenolmethane type epoxy compound, or an epoxy compound having a cyclohexene oxide group. More preferably, the epoxy compound in the component (B) is an epoxy compound having at least two epoxy groups. The composition of the present invention may contain a plurality of kinds of the epoxy compounds in the component (B). Examples of the plurality of kinds of the epoxy compounds include a combination of an epoxy compound having at least one norbornane structure and at least two epoxy groups with at least one epoxy compound selected from a biphenyl type epoxy compound, a trisphenolmethane type epoxy compound, a naphthalene type epoxy compound, a novolac type epoxy compound, a phenol aralkyl type epoxy compound, and an epoxy compound having a cyclohexene oxide group.

The epoxy equivalent of the component (B), the epoxy compound, is preferably 50 g/eq or more and 400 g/eq or less, more preferably 80 g/eq or more and 300 g/eq or less, in terms of improving reactivity.

The number of epoxy groups (mol) of the component (B), the epoxy compound, is calculated from the epoxy equivalent. In the case where the composition of the present invention contains a plurality of kinds of the epoxy compounds in the component (B), the number of epoxy groups is the total number of the epoxy groups of such compounds.

(Biphenyl Type Epoxy Compound)

The biphenyl type epoxy compound is not particularly limited without departing the gist of the present invention and is preferably an epoxy compound represented by a structure of the following formula (3-1) or (3-2). As of the biphenyl type epoxy compound, any one of an epoxy compound represented by a structure of the following formula (3-1) and an epoxy compound represented by a structure of the following formula (3-2) may be used singly, or the two kinds of compounds may be used in mixture. The biphenyl type epoxy compound is more preferably an epoxy compound represented by a structure of the following formula (3-1):

[Chem. 4]

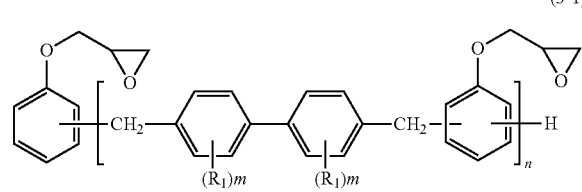

(3-1)

wherein in the formula (3-1), $R_1$ is a substituent, being an alkyl group having 1 to 4 carbon atoms, and each $R_1$ is optionally the same or different; m represents the number of the substituent(s) $R_1$ and is an integer of 0 to 4; and n represents an average value and is 1 to 10;

[Chem. 5]

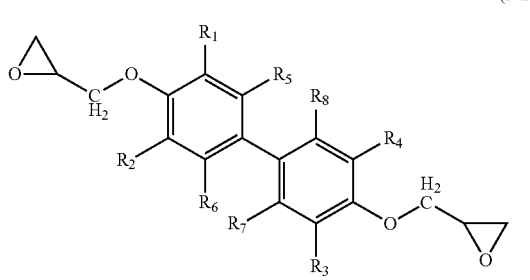

(3-2)

wherein in the formula (3-2), $R_1$ to $R_8$ represent a hydrogen atom, a halogen atom, or an alkyl group having 1 to 4 carbon atoms, and are each optionally the same or different.

In formula (3-1), m is preferably 0 to 2, more preferably 0. In formula (3-1), n is preferably 1 to 5, more preferably 2 to 4. Examples of the alkyl group having 1 to 4 carbon atoms as the substituent $R_1$ in formula (3-1) include a methyl group, an ethyl group, a propyl group, a butyl group, and the like. The substituent $R_1$ is preferably a methyl group or an ethyl group. The biphenyl type epoxy compound may also be a mixture of compounds represented by formula (3-1), wherein the compounds are different from each other in $R_1$, m, and n in the formula.

Examples of the alkyl group having 1 to 4 carbon atoms as $R_1$ to $R_8$ in formula (3-2) include a methyl group, an ethyl group, a propyl group, a butyl group, and the like. $R_1$, $R_2$, $R_3$, $R_4$, $R_5$, $R_6$, $R_7$, and $R_8$ are each preferably a hydrogen atom or a methyl group. The biphenyl type epoxy compound may also be a mixture of compounds represented by formula (3-2), wherein the compounds are different from each other in $R_1$ to $R_8$ in the formula.

In the other preferred embodiment of the present invention, a biphenyl type epoxy compound used in the present invention is represented by formula (3-2) wherein $R_1$, $R_2$, $R_3$, and $R_4$ are each an alkyl group having 1 to 4 carbon atoms, and $R_5$, $R_6$, $R_7$, and $R_8$ are each a hydrogen atom. In still the other preferred embodiment of the present invention, a biphenyl type epoxy compound used in the present invention is represented by formula (3-2) wherein $R_1$, $R_2$, $R_3$, and $R_4$ are each a methyl group, and $R_5$, $R_6$, $R_7$, and $R_8$ are each a hydrogen atom.

Any commercially available product can also be used as the biphenyl type epoxy compound. Examples of commercially available products of epoxy compounds represented by a structure of formula (3-1) include NC3000 (a tradename; from NIPPON KAYAKU CO., LTD.; having an epoxy equivalent of 265 to 285 g/eq), NC3000-L (a tradename; from NIPPON KAYAKU CO., LTD.; having an epoxy equivalent of 261 to 282 g/eq), NC3000-H (a tradename; from NIPPON KAYAKU CO., LTD.; having an epoxy equivalent of 280 to 300 g/eq), NC3000-FH-75M (a tradename; from NIPPON KAYAKU CO., LTD.; having an epoxy equivalent of 310 to 340 g/eq), NC3100 (a tradename; from NIPPON KAYAKU CO., LTD.; having an epoxy equivalent of 245 to 270 g/eq), and the like. Examples of commercially available products of epoxy compounds represented by a structure of formula (3-2) include YX4000 (a tradename; from MITSUBISHI CHEMICAL CORPORATION; having an epoxy equivalent of 180 to 192 g/eq), YX4000H (a tradename; from MITSUBISHI CHEMICAL CORPORATION; having an epoxy equivalent of 187 to 197 g/eq), YL6121H (a tradename; from MITSUBISHI CHEMICAL CORPORATION; having an epoxy equivalent of 170 to 180 g/eq), and the like. These may be used singly or in combination of two or more kinds thereof.

(Epoxy Compound Having at Least One Norbornane Structure and at Least Two Epoxy Groups)

The epoxy compound having at least one norbornane structure and at least two epoxy groups is preferably an alicyclic epoxy compound, more preferably has an epoxy structure represented by the following formula (4), bound to a 5-membered ring, a 6-membered ring or a norbornane ring. These may be used singly or in combination of two or more kinds thereof.

[Chem. 6]

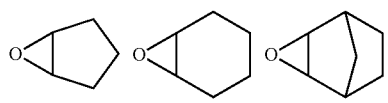

(4)

Specific examples of the alicyclic epoxy compound can include a compound represented by the following formula (5).

[Chem. 7]

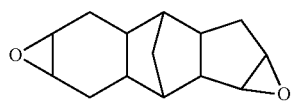

(5)

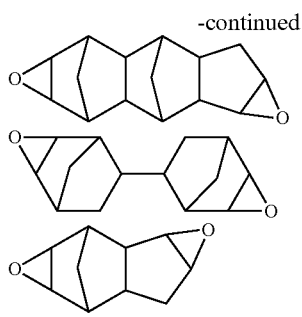

A production example of the alicyclic epoxy compound in the component (B) is described.

A compound of the following formula (5-1) (epoxy equivalent: 109 g/eq) can be produced by, for example, synthesizing a compound (a) having the following norbornane structure, by a Diels-Alder reaction of butadiene and dicyclopentadiene, and then reacting the compound (a) and meta-chloroperbenzoic acid, as represented in the following formula (6).

[Chem. 8]

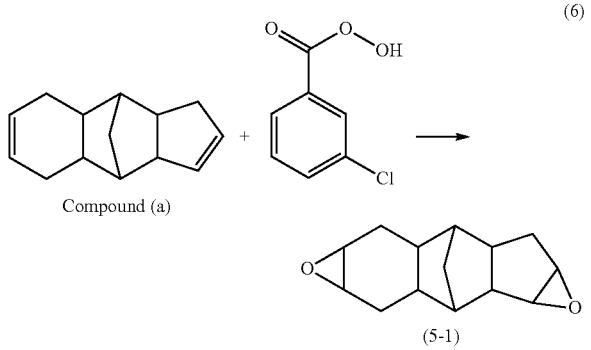

A compound of the following formula (5-2) (epoxy equivalent: 115 g/eq) can be produced by, for example, synthesizing a compound (b) (tricyclopentadiene) having the following norbornane structure, by a Diels-Alder reaction of cyclopentadiene and dicyclopentadiene, and then reacting the compound (b) and meta-chloroperbenzoic acid, as represented in the following formula (7).

[Chem. 9]

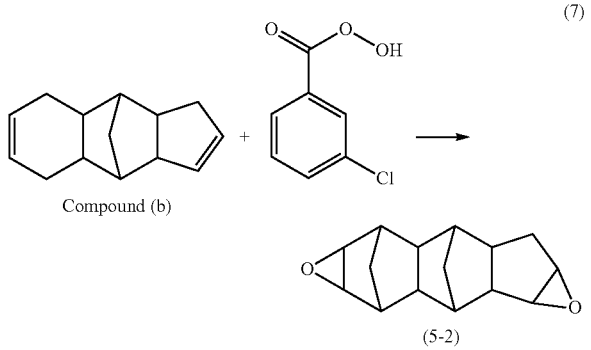

A compound of the following formula (5-3) (epoxy equivalent: 109 g/eq) can be produced by, for example, synthesizing a compound (c) having the following norbornane structure, by a Diels-Alder reaction of butadiene and cyclopentadiene, and then reacting the compound (c) and meta-chloroperbenzoic acid, as represented in the following formula (8).

[Chem. 10]

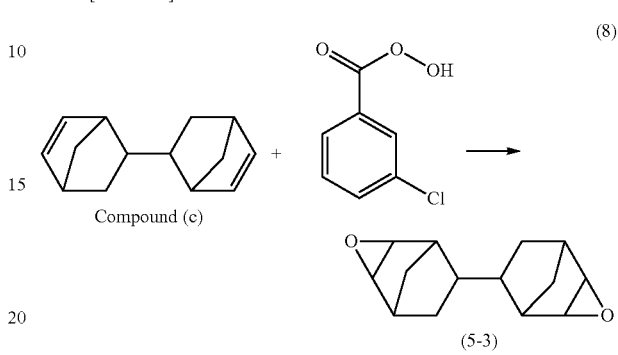

A compound of the following formula (5-4) (epoxy equivalent: 82.1 g/eq) can be produced by, for example, reacting dicyclopentadiene and potassium peroxymonosulfate (oxone). The compound of formula (5-4), dicyclopentadiene diepoxide, may also be any commercially available product, and examples of such any commercially available product can include dicyclopentadiene diepoxide manufactured by SHANDONG QIHUAN BIOCHEMICAL CO., LTD.

[Chem. 11]

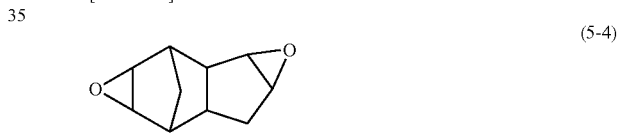

(Trisphenolmethane Type Epoxy Compound)

The trisphenolmethane type epoxy compound is not particularly limited without departing the gist of the present invention, and is preferably an epoxy compound represented by a structure of the following formula (9):

[Chem. 12]

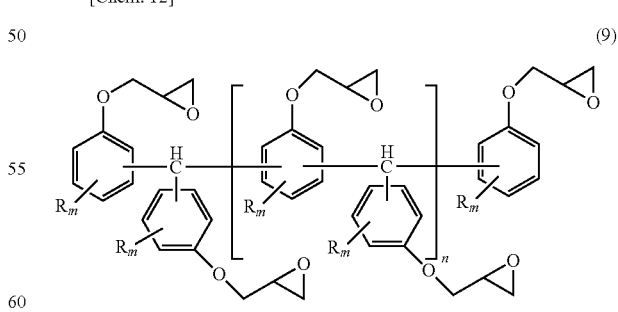

wherein in the formula (9), each R is a substituent and independently represents an alkyl group having 1 to 6 carbon atoms, an allyl group or a phenyl group; m represents the number of the substituent(s) R and is an integer of 0 to 3; and n represents an average value, satisfying 0 n 10.

In formula (9), m is preferably 0 to 2, more preferably 0. In formula (9), n is preferably 0 or more and 5 or less. Examples of the alkyl group having 1 to 6 carbon atoms as the substituent R in formula (9) include a methyl group, an ethyl group, a propyl group, a butyl group, a cyclohexyl group, and the like. The substituent R is preferably a methyl group. The trisphenolmethane type epoxy compound may also be a mixture of compounds represented by formula (9), wherein the compounds are different from each other in R, m, and n in the formula.

Any commercially available product can also be used as the trisphenolmethane type epoxy compound. Examples of such commercially available products include EPPN-501H (a tradename; manufactured by NIPPON KAYAKU CO., LTD.; having an epoxy equivalent of 162 to 172 g/eq and a softening point of 51 to 57° C.), EPPN-501HY (a tradename; manufactured by NIPPON KAYAKU CO., LTD.; having an epoxy equivalent of 163 to 175 g/eq and a softening point of 57 to 63° C.), EPPN-502H (a tradename; manufactured by NIPPON KAYAKU CO., LTD.; having an epoxy equivalent of 158 to 178 g/eq and a softening point of 60 to 72° C.), EPPN-503 (a tradename; manufactured by NIPPON KAYAKU CO., LTD.; having an epoxy equivalent of 170 to 190 g/eq and a softening point of 80 to 100° C.), and the like. These may be used singly or in combination of two or more kinds thereof.

(Naphthalene Type Epoxy Compound)

The naphthalene type epoxy compound is not particularly limited without departing from the gist of the present invention, and examples thereof include a naphthyleneether type epoxy compound, a binaphthalene type epoxy compound, a naphthol type epoxy compound, and the like. The naphthalene type epoxy compound is preferably a naphthyleneether type epoxy compound or a binaphthalene type epoxy compound.

(Naphthyleneether Type Epoxy Compound)

The naphthyleneether type epoxy compound is not particularly limited without departing the gist of the present invention, and is preferably an epoxy compound represented by a structure of the following formula (10):

[Chem. 13]

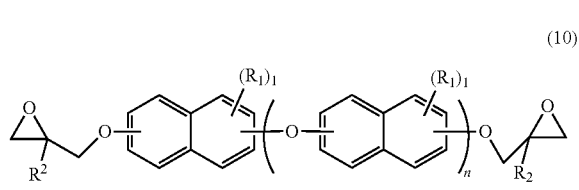

(10)

wherein in the formula (10), n is an integer of 1 to 20; I is an integer of 0 to 2; $R_1$ is a substituent and independently represents a benzyl group, an alkyl group or a structure represented by formula (10a); and each $R_2$ independently represents a hydrogen atom or a methyl group;

[Chem. 14]

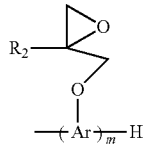

(10a)

wherein in the formula (10a), each Ar independently represents a phenylene group or a naphthylene group; each $R_2$ independently represents a hydrogen atom or a methyl group; and m is an integer of 1 or 2.

The naphthyleneether type epoxy compound may also be a mixture of compounds represented by formula (10), wherein the compounds are different from each other in $R_1$, $R_2$, I and n in the formula.

Examples of naphthyleneether type epoxy compounds represented by the general formula (10) include one represented by formula (10-1):

[Chem. 15]

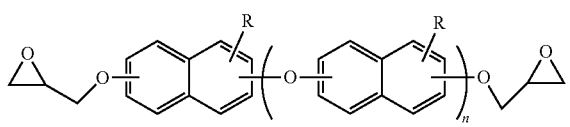

(10-1)

wherein in the formula (10-1), n is an integer of 1 to 20, preferably an integer of 1 to 10, more preferably an integer of 1 to 8; and R is a substituent and independently represents a benzyl group, an alkyl group, a structure represented by the following general formula (10a-1), or not present, and the substituent R is preferably not present;

[Chem. 16]

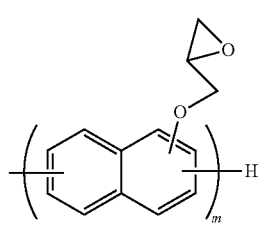

(10a-1)

wherein in the formula (10a-1), m is an integer of 1 or 2.

Examples of naphthyleneether type epoxy compounds represented by formula (10-1) include those represented by formulae (10-2) to (10-6). These may be used singly or in combination of two or more kinds thereof.

[Chem. 17]
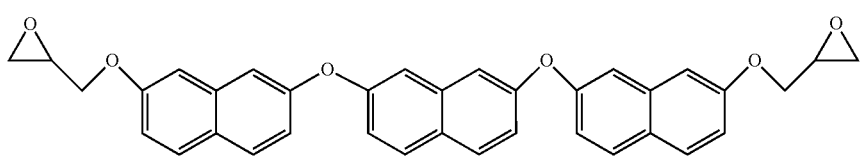
(10-2)
[Chem. 18]
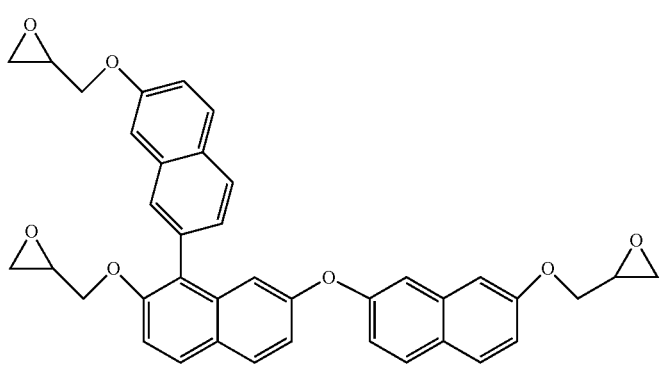
(10-3)
[Chem. 19]
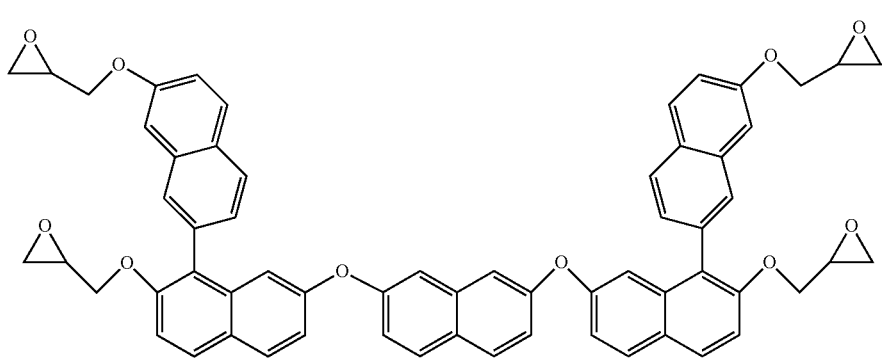
(10-4)
[Chem. 20]
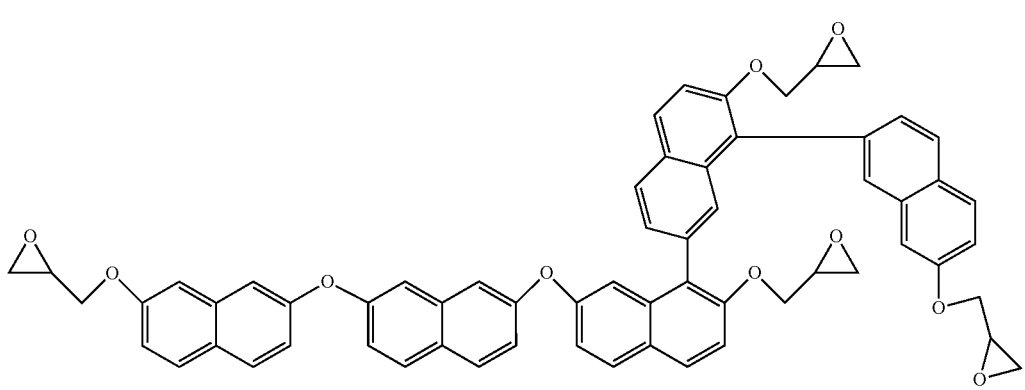
(10-5)
[Chem. 21]
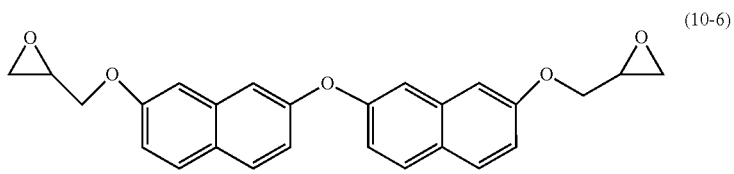
(10-6)

Any commercially available product can also be used as the naphthyleneether type epoxy compound. Examples of commercially available products of the naphthyleneether type epoxy compound include HP-6000 (a tradename; from DIC CORPORATION; having an epoxy equivalent of 235 to 255 g/eq), EXA-7310 (a tradename; from DIC CORPORATION; having an epoxy equivalent of 237 to 257 g/eq), EXA-7311 (a tradename; from DIC CORPORATION; having an epoxy equivalent of 267 to 287 g/eq), EXA-7311L (a tradename; from DIC CORPORATION; having an epoxy equivalent of 252 to 272 g/eq), EXA-7311-G3 (a tradename; from DIC CORPORATION; having an epoxy equivalent of 240 to 260 g/eq), and the like. These may be used singly or in combination of two or more kinds thereof.

(Binaphthalene Type Epoxy Compound)

The binaphthalene type epoxy compound is not particularly limited without departing the gist of the present invention and without containing the naphthyleneether type epoxy compound described above, and is preferably an epoxy compound represented by a structure of the following formula (11):

[Chem. 22]

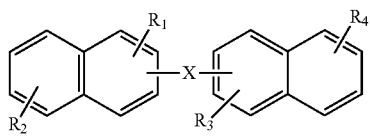

(11)

wherein in the formula (11), X represents an alkylene group having 1 to 8 carbon atoms; $R_1$ to $R_4$ represent any of a group represented by formula (11a), a hydrogen atom, a halogen atom, a phenyl group, and an alkyl group having 1 to 4 carbon atoms; $R_1$ to $R_4$ may be added to any ring of the naphthalene skeleton, or may be added to both rings at the same time; among $R_1$ to $R_4$, at least two or more on average need to contain a group represented by the following general formula (11a), and the other Rs may be the same or different from each other.

[Chem. 23]

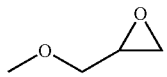

(11a)

The binaphthalene type epoxy compound may also be a mixture of compounds represented by formula (11), wherein the compounds are different from each other in $R_1$ to $R_4$, and X in the formula.

Examples of the binaphthalene type epoxy compound include a bifunctional or higher-functional binaphthalene type epoxy compound, preferably bifunctional, trifunctional or tetrafunctional binaphthalene type epoxy compound, and more preferably a bifunctional binaphthalene type epoxy compound represented by the following formula (11-1).

[Chem. 24]

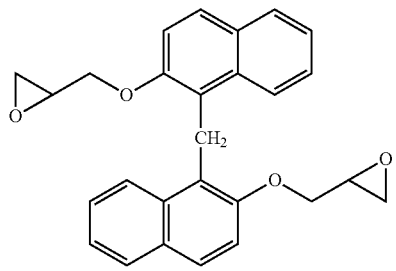

(11-1)

Any commercially available product can also be used as the binaphthalene type epoxy compound. Examples of commercially available products of the bifunctional binaphthalene type epoxy compound include HP-4770 (a trade name; from DIC CORPORATION; having an epoxy equivalent of 200 to 210 g/eq), and the like. Examples of commercially available products of the trifunctional binaphthalene type epoxy compound include EXA-4750 (a trade name; from DIC CORPORATION; having an epoxy equivalent of 185 g/eq), and the like. Examples of commercially available products of the tetrafunctional binaphthalene type epoxy compound include HP-4710 (a trade name; from DIC CORPORATION; having an epoxy equivalent of 160 to 180 g/eq), HP-4700 (a trade name; from DIC CORPORATION; having an epoxy equivalent of 160 to 170 g/eq), and the like. These may be used singly or in combination of two or more kinds thereof.

(Epoxy Compound Having a Cyclohexene Oxide Group)

The epoxy compound having a cyclohexene oxide group is not particularly limited without departing the gist of the present invention and without containing the norbornane structure described above, and is preferably an epoxy compound represented by a structure of the following formula (13):

[Chem. 25]

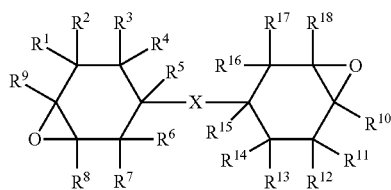

(13)

wherein in the formula (13), each $R^1$ to $R^{18}$ independently represent a hydrogen atom, a halogen atom, or a hydrocarbon group, where the hydrocarbon group optionally contains an oxygen atom or a halogen atom; and X is a single bond or divalent organic group.

Each $R^1$ to $R^{18}$ in formula (13) independently represents a hydrogen atom, a halogen atom, or a hydrocarbon group which optionally contains an oxygen atom or a halogen atom, and is preferably selected from the group consisting of a hydrogen atom and a hydrocarbon group, and is more preferably a hydrogen atom.

Examples of the halogen atom in $R^1$ to $R^{18}$ in formula (13) include a fluorine atom, a chlorine atom, a bromine atom, an iodine atom and the like.

Examples of the hydrocarbon group in $R^1$ to $R^{18}$ in formula (13) include an aliphatic hydrocarbon group and the like. Examples of the aliphatic hydrocarbon group include alkyl group having about 1 to 20 carbon atoms (preferably 1 to 10, more preferably 1 to 3) such as a methyl group, an ethyl group, a propyl group, an isopropyl group, a butyl group, an isobutyl group, an s-butyl group, a t-butyl group, a pentyl group, a hexyl group, a decyl group and a dodecyl group; alkenyl group having about 2 to 20 carbon atoms (preferably 2 to 10, more preferably 2 to 3), such as vinyl group, allyl group, methallyl group, 1-propenyl group, isopropenyl group, 1-butenyl group, 2-butenyl group, 3-butenyl group, 1-pentenyl group, 2-pentenyl group, 3-pentenyl group, 4-pentenyl group, and 5-hexenyl group; alkynyl group having about 2 to 20 carbon atoms (preferably 2 to 10, more preferably 2 to 3) such as an ethynyl group and a propynyl group.

Examples of the hydrocarbon group which optionally contains an oxygen atom or a halogen atom in $R^1$ to $R^{18}$ in formula (13) include a group in which at least one hydrogen atom in the hydrocarbon group as described above is substituted by a group having an oxygen atom or a halogen atom, and the like. Examples of the group having an oxygen atom include $C_{1-10}$ alkoxy group such as methoxy, ethoxy, propoxy, isopropyloxy, butoxy, and isobutyloxy groups.

In formula (13), X is a single bond or divalent organic group. Examples of the divalent organic group include a divalent hydrocarbon group, an alkenylene group in which a part or all of the carbon-carbon double bond(s) are epoxidized, a carbonyl group (—CO—), an ether bond (—O—), an ester bond (—COO—), a carbonate group (—O—CO—O—), an amide group (—CONH—), —CO—O—CH$_2$—, a group in which a plurality of these are linked, and the like.

Examples of the epoxy compound having a cyclohexene oxide group include (3,4,3',4'-diepoxy)bicyclohexyl, bis(3, 4-epoxycyclohexylmethyl)ether, 2,2-bis(3,4-epoxycyclohexan-1-yl)propane, 1,2-bis(3,4-epoxycyclohexan-1-yl)ethane and the like.

Any commercially available product can also be used as the epoxy compound having a cyclohexene oxide group. Examples of the epoxy compound having a cyclohexene oxide group include Celloxide 2021P (a trade name; from DAICEL CORPORATION; having an epoxy equivalent of 128 to 145 g/eq), Celloxide 8010 (a trade name; from DAICEL CORPORATION; having an epoxy equivalent of 95 to 105 g/eq), and the like. These may be used singly or in combination of two or more kinds thereof.

The compounding ratio between the benzoxazine compound in the component (A) and the epoxy compound in the component (B) is preferably 10 parts by mass or more and 300 parts by mass or less, more preferably 40 parts by mass or more and 200 parts by mass or less, based on 100 parts by mass of the component (A). When the compounding ratio of the component (A) and component (B) is in the above range, a more excellent heat resistance can be obtained.

In the case where the composition of the present invention contains a plurality of kinds of the benzoxazine compounds in the component (A), the total of such compounds is assumed to be 100 parts by mass. In the case where the composition of the present invention contains a plurality of kinds of the epoxy compounds in the component (B), the component (B) as described above means the total of such a plurality of kinds of compounds.

(Component C)

The component (C) that constitutes the curable resin composition is a phenol-based curing agent.

The component (C) is not particularly limited without departing from the gist of the present invention, and examples thereof include monofunctional phenol, multifunctional phenol compounds (for example, bisphenol A, bisphenol F, dihydroxynaphthalene, bisphenol sulfide (for example, bis(4-hydroxyphenyl)sulfide, and the like), polyphenol compounds (for example, pyrogallol, and the like)), phenol novolac resins, phenol aralkyl resins (for example, phenol aralkyl resin having a biphenylene skeleton, phenol aralkyl resin having a phenylene skeleton), and the like. Preferably, the component (C) is bisphenol F or bisphenol sulfide. These may be used singly or as a mixture of two or more kinds thereof.

Any commercially available product can also be used as the phenol-based curing agent in the component (C). Examples thereof include bisphenol F (manufactured by HONSHU CHEMICAL INDUSTRY CO., LTD., having a hydroxyl group equivalent of 100 g/eq), bis(4-hydroxyphenyl)sulfide (TDP, manufactured by TOKYO CHEMICAL INDUSTRY CO., LTD., having a hydroxyl group equivalent of 109 g/eq), 2,7-dihydroxynaphthalene (manufactured by TOKYO CHEMICAL INDUSTRY CO., LTD., having a hydroxyl group equivalent of 80 g/eq), pyrogallol (manufactured by TOKYO CHEMICAL INDUSTRY CO., LTD., having a hydroxyl group equivalent of 42 g/eq), a phenol novolac resin (for example, phenolite TD-2106, manufactured by DIC CORPORATION, having a hydroxyl group equivalent of 104 g/eq; phenolite TD-2090, manufactured by DIC CORPORATION, having a hydroxyl group equivalent of 105 g/eq), a phenol aralkyl resin (for example, MEHC-7851SS, having a hydroxyl group equivalent of 203 g/eq, manufactured by MEIWA PLASTIC INDUSTRIES, LTD.; MEH-7800-4S, having a hydroxyl group equivalent of 169 g/eq, manufactured by MEIWA PLASTIC INDUSTRIES, LTD.), and the like. These may be used singly or in combination of two or more kinds thereof.

The compounding ratio of the component (C) is preferably in a range of 1 part by mass or more and 30 parts by mass or less, more preferably in a range of 2 parts by mass or more and 25 parts by mass or less, in terms the compounding ratio of the component (C) based on 100 parts by mass in total of the components (A) and (B). The component (C) can be contained in such a range, thereby obtaining a cured product more excellent in high heat resistance.

The hydroxyl group equivalent of the component (C), phenol-based curing agent, is preferably 30 g/eq or more and 400 g/eq or less, more preferably 40 g/eq or more and 250 g/eq or less, in terms of improving reactivity.

The number of hydroxyl groups (mol) of the phenol-based curing agent in the component (C) is calculated from the hydroxyl group equivalent. In the case where the composition of the present invention contains a plurality of kinds of the phenol-based curing agents in the component (C), the number of hydroxyl groups is the total number of hydroxyl groups of such curing agents.

In the curable resin composition of the present invention, the number of epoxy groups in the epoxy compound in the component (B), the number of benzoxazine rings in the benzoxazine compound in the component (A), and the number of hydroxyl groups in the phenol-based curing agent in the component (C) preferably have the ratio of the number of functional groups which satisfies the following formula (2).

[Math. 2]

$$\text{Number of epoxy groups/(Number of benzoxazine rings+Number of hydroxyl groups)}=0.5 \text{ to } 1.8 \quad (2)$$

The ratio of the number of functional groups in formula (2) is more preferably 0.7 to 1.8, further preferably 0.8 to 1.5, and further preferably 0.9 to 1.4. When the ratio of the number of functional groups in each component in formula (2) is in the above range, a curable resin composition being more excellent in curability at low temperature and a cured product being more excellent in heat resistance can be obtained.

Further, in the curable resin composition of the present invention, the ratio of the number of benzoxazine rings in the component (A), the benzoxazine compound, to the number of hydroxyl groups in the component (C), the phenol-based curing agent (the number of benzoxazine rings/number of hydroxyl groups) is preferably 1.1 to 8.0.

The ratio of the number of functional groups herein (the number of benzoxazine rings/the number of hydroxyl groups) is more preferably 1.1 to 7.8, and further preferably 2.0 to 4.6.

When the ratio of the number of functional groups is in the above range, a curable resin composition being more excellent in curability at low temperature and a cured product being more excellent in heat resistance can be obtained.

(Component D)

The curable resin composition of the present invention may further contain, if desired, (D) a curing accelerator. A known curing accelerator can be used as the curing accelerator, and examples include amine-based compounds such as tributylamine and 1,8-diazabicyclo(5,4,0)undecene-7, imidazole-based compounds such as 2-methylimidazole, 2-ethylimidazole and 1,2-dimethylimidazole, and phosphororganic compounds including phosphororganic compounds with phosphorus bound by only a covalent bond, such as triphenylphosphine, and salt-type phosphororganic compounds with phosphorus bound by a covalent bond and an ionic bond, such as tetraphenylphosphonium tetraphenylborate, bis(tetrabutylphosphonium)(BTBP)-pyromellitic acid, and tetrabutylphosphonium 2,6-bis[(2-hydroxy-5-methylphenyl)methyl]-4-methylphenolate (TBP-3PC), but are not limited thereto. The above curing accelerators may be used singly or in combination of two or more kinds thereof. Among them, phosphororganic compounds such as triphenylphosphine, tetra phenylphosphonium tetraphenylborate and tetra butylphosphonium 2,6-bis[(2-hydroxy-5-methylphenyl)methyl]-4-methylphenolate exert a high effect of enhancing the speed of curing and thus are preferable.

Such a phosphororganic compound described above preferably exert a function of promoting a crosslinking reaction of an epoxy group and a phenolic hydroxyl group, as described in JP S55-157594 A. Furthermore, such a phosphororganic compound described above also preferably exerts a function of promoting a reaction of a hydroxyl group and an epoxy group generated in a cleavage reaction of (A) the benzoxazine compound at high temperatures.

The compounding ratio of the component (D) is preferably in a range of 0.01 parts by mass or more and 10 parts by mass or less, more preferably in a range of 0.1 parts by mass or more and 5 parts by mass or less, in terms the compounding ratio of the component (D) based on 100 parts by mass in total of the components (A), (B), and (C). The component (D) can be contained in such a range, thereby providing a curable resin composition having more excellent fast curability.

(Component E)

The curable resin composition of the present invention may further contain, if desired, (E) an inorganic filler. For example, in the case of use of the curable resin composition of the present invention in a sealant application of a semiconductor element or the like, the component (E) is preferably contained. The inorganic filler for use in the present invention is not particularly limited, and can be selected in consideration of an application of the curable resin composition or a cured product thereof, or characteristics to be provided. Hereinafter, the inorganic filler is referred to as "component (E)".

Examples of the component (E) include oxides such as silica, alumina, titanium oxide, zirconium oxide, magnesium oxide, cerium oxide, yttrium oxide, calcium oxide, antimony trioxide, zinc oxide and iron oxide; carbonates such as calcium carbonate, magnesium carbonate, barium carbonate and strontium carbonate; sulfates such as barium sulfate, aluminum sulfate and calcium sulfate; nitrides such as aluminum nitride, silicon nitride, titanium nitride, boron nitride and manganese nitride; silicon compounds such as calcium silicate, magnesium silicate and aluminum silicate; boron compounds such as aluminum borate; zirconium compounds such as barium zirconate and calcium zirconate; phosphorus compounds such as zirconium phosphate and magnesium phosphate; titanium compounds such as strontium titanate, calcium titanate, magnesium titanate, bismuth titanate, barium titanate and potassium titanate; minerals such as mica, talc, kaolin, kaolin clay, kaolinite, halloysite, cordierite, pyrophyllite, montmorillonite, sericite, amesite, bentonite, asbestos, wollastonite, sepiolite, xonotlite, zeolite, hydrotalcite, hydrated gypsum, alum, diatomaceous earth and boehmite; fly ash, dewatered sludge, glass beads, glass fibers, silica sand, magnesium oxysulfate, silicon oxide, and silicon carbide; metals such as copper, iron, cobalt and nickel, or alloys including any of such metals; magnetic materials such as sendust, alnico magnet and ferrite; and graphite and coke.

The component (E) is preferably silica or alumina. Examples of the silica include molten silica, spherical silica, crystalline silica, amorphous silica, synthetic silica and hollow silica, and spherical silica and crystalline silica are preferable. The component (E) may be used singly or in combination of two or more kinds thereof.

The component (E) may be particulate, and in such a case, the average particle size is not particularly limited, and may be, for example, 0.01 µm or more and 150 µm or less, preferably 0.1 µm or more and 120 µm or less, more preferably 0.5 µm or more and 75 µm or less. Such a range leads to a more improvement in packing ability into a mold cavity in use of the composition of the present invention in, for example, a sealant application of a semiconductor element. The average particle size of the component (E) can be measured by a laser diffraction/scattering method. Specifically, the average particle size can be determined by creating the particle size distribution of the inorganic filler on a volume basis, with a laser diffraction-type particle size distribution measuring apparatus, and defining the median size as the average particle size. A measurement sample that can be used is preferably obtained by ultrasonically dispersing the inorganic filler in water. The laser diffraction-type particle size distribution measuring apparatus that can be used is, for example, "LA-500", "LA-750", "LA-950" or "LA-960" manufactured by HORIBA LTD.

The compounding ratio of the component (E) is not particularly limited and can be appropriately selected depending on its application as long as a cured product of the curable resin composition having a high heat resistance can be obtained. For example, in the case of use of the composition in a semiconductor-sealing application, the following compounding ratio is preferable.

The lower limit value of the compounding ratio of the component (E) is, for example, 150 parts by mass or more, preferably 400 parts by mass or more, and more preferably 500 parts by mass or more, based on 100 parts by mass in total of the components (A), (B), (C) and (D). The upper limit value of the compounding ratio of the component (E) is, for example, 1300 parts by mass or less, preferably 1150 parts by mass or less, and more preferably 950 parts by mass or less. The lower limit value of the compounding ratio of the component (E) is 400 parts by mass or more, thereby enabling an increase in the amount of moisture absorption according to curing of the curable resin composition and a reduction in strength to be more suppressed, and thus enabling a cured product having more favorable solder cracking resistance to be obtained. The upper limit value of the compounding ratio of the component (E) is 1300 parts by mass or less, thereby allowing the curable resin composition to have better fluidity and thus be easily packed into a mold, resulting in exertion of favorable sealing performance of a cured product.

(Other Component(s))

The composition of the present invention may contain a benzoxazine compound other than the component (A), without departing from the gist of the present invention. For example, in the case where the composition is demanded to be reduced in viscosity, a monofunctional benzoxazine compound having one benzoxazine ring may be added to the composition.

For example, nano-carbon, a flame retardant, a release agent, a colorant, a low-stress additive, a metal hydroxide, and/or the like can be compounded into the curable resin composition of the present invention as long as performances of the curable resin composition are not impaired.

Examples of the nano-carbon include carbon nanotube, fullerene or respective derivatives.

Examples of the flame retardant include red phosphorus, phosphates such as triphenyl phosphate, tricresyl phosphate, trixylenyl phosphate, cresyl diphenyl phosphate, xylenyl diphenyl phosphate, resorcinol bis-phenyl phosphate, bisphenol A bis-diphenyl phosphate, borates, and phosphazene.

Examples of release agents include: stearates; natural waxes such as carnauba wax; synthetic waxes such as oxidized polyethylene wax; higher fatty acids such as stearic acid or esters of the higher fatty acids; metal salts such as zinc stearate; paraffin; and silicone oil.

Examples of colorants include carbon black, colcothar, and titanium oxide.

Examples of low-stress additives include silicone oil and silicone rubber.

Examples of metal hydroxides include hydroxides such as calcium hydroxide, aluminum hydroxide, and magnesium hydroxide.

In a case where the component (E), an inorganic filler, is contained, a silane coupling agent may be compounded together.

The compounding ratio of such other component(s) is preferably in a range of 0.01 parts by mass or more and 10 parts by mass or less, more preferably in a range of 0.1 parts by mass or more and 7 parts by mass or less in terms of the compounding ratio of such other component(s) based on 100 parts by mass in total of the components (A), (B), and (C).

(Characteristics of Curable Resin Composition)

The curing performance of a curable resin composition of the present invention can be measured as the thermophysical property (reaction peak temperature) determined by differential scanning calorimetry (DSC). Specifically, the thermophysical property can be measured using a differential scanning calorimetry, under the conditions of temperature rise of 10° C./min and a temperature range of 30° C. to 300° C. The highest point in the graph is defined as the reaction peak temperature. From viewpoint of reactivity, the reaction peak temperature is preferably 255° C. or lower, and more preferably 245° C. or lower.

[Method of Producing Curable Resin Composition]

Next, the method of producing the curable resin composition of the present invention is described.

The curable resin composition of the present invention can be produced by kneading or mixing the components (A) to (C), and further, if desired, the components (D) and (E), other component(s), and a solvent, which are appropriately added.

The kneading or mixing method is not particularly limited, and the mixing can be made using, for example, a mixing apparatus or a kneading machine such as a planetary mixer, a twin-screw extruder, a heat roll or a kneader. For example, in the case where the components (A), (B), and (C) are highly viscous liquids or solids at room temperature or in the case where the component (E) is contained, if necessary, heating and kneading may be made or kneading may be made under a pressure or reduced pressure condition. The heating temperature is preferably 80 to 120° C. The curable resin composition, which contains the component (E), is a solid at room temperature, and thus may be heated and kneaded, and thereafter cooled and pulverized to provide a powder, or the powder may be tabletted and thus formed into a pellet. The powder may also be granulated and thus formed into a granule.

In the case where the curable resin composition of the present invention, which does not contain any component (E), is used in an application of prepreg for FRP, the curable resin composition preferably has a viscosity of 10 to 3000 Pa·s at 50° C. The viscosity is more preferably 10 to 2500 Pa·s, further preferably 100 to 2000 Pa·s. In the case where the curable resin composition of the present invention is used in a sealant or coating application, the viscosity is not particularly limited as long as working such as sealing or coating is not impaired.

[Cured Product]

The cured product of the curable resin composition of the present invention is characterized by being high in glass transition temperature and being excellent in heat resistance. The reason why such an excellent cured product is formed by the curable resin composition of the present invention is considered as follows.

In the homopolymerization of benzoxazine, a phenolic hydroxyl group is first produced by polymerization. It is considered that this phenolic hydroxyl group undergoes a keto-enol tautomerization at a high temperature, for example, 200° C. or higher, hereby resulting in cleavage of a polymer chain, and thus causing lower heat resistance as well as lower glass transition temperature.

On the other hand, it is considered that the curable resin composition of the present invention exhibits an extremely high curing rate even at a low temperature and forms a dense crosslinked structure by using the benzoxazine compound represented by the structure of formula (1) and the epoxy compound in combination, resulting in excellent curability at low temperature.

(Characteristics of Cured Product)

The heat resistance of the cured product of the present invention can be evaluated by measuring the glass transition temperature. The glass transition temperature is, for example, 210° C. or higher, preferably 220° C. or higher. In the case where the curable resin composition contains the component (E), the glass transition temperature is, for example, 215° C. or higher, preferably 230° C. or higher. The glass transition temperature can be measured by differential scanning calorimetry (DSC). Such a measurement can be simply performed by using a commercially available differential scanning calorimeter (for example, manufactured by HITACHI HIGH-TECH SCIENCE CORPORATION).

[Method of Producing Cured Product]

The cured product of the present invention can be produced by performing ring-opening polymerization for curing, under the same curing conditions as those for known benzoxazine compound and/or epoxy compound. Examples include the following method.

First, the curable resin composition of the present invention is produced by the above method. Subsequently, the resulting curable resin composition can be heated at, for example, 150 to 300° C. for a curing time of, for example, 20 seconds to 5 hours, preferably 20 seconds to 1 hour, to obtain a cured product. While a curing time of 1 to 3 minutes is sufficient for the continuous production of the cured product, further heating the composition for about 5 minutes to 5 hours in post-curing is preferred for achieving a higher strength.

The cured product can also be obtained by compounding a benzoxazine compound other than the component (A) and/or an epoxy compound other than the component (B), without departing from the gist of the present invention.

In the case where a film-shaped molded product is obtained as the cured product, a solvent can further be compounded to provide a composition which has a suitable solution viscosity for film formation. The solvent is not particularly limited as long as the components (A) to (D) can be dissolved therein, and examples thereof include hydrocarbons, ethers, esters, halogen-containing solvents, and the like.

In the case of such a solution-type curable resin composition dissolved in the solvent, the cured product can be obtained by coating a substrate with the solution-type curable resin composition, thereafter volatilizing the solvent, and then performing thermal curing.

[Semiconductor Device]

The semiconductor device of the present invention is a semiconductor device in which a semiconductor element is disposed in a cured product obtained by curing the curable resin composition of the present invention, the composition containing the components (A) to (C), and, if desired, the components (D), (E), and/or (an)other component(s). The semiconductor element here is usually supported and secured by a lead frame being a thin plate of a metallic material. The phrase "semiconductor element is disposed in a cured product" means that the semiconductor element is sealed by a cured product of the curable resin composition, and represents the state where the semiconductor element is covered with the cured product. In such a case, the entire semiconductor element may be covered, or the surface of the semiconductor element disposed on a base plate may be covered.

In the case where the semiconductor device is produced by sealing any of various electronic components, such as a semiconductor element, with the cured product of the present invention, the semiconductor device can be produced by performing a sealing step according to a conventional molding method, such as transfer molding, compression molding, or injection molding.

EXAMPLES

Hereinafter, the present invention will be specifically described with reference to Examples and Comparative Examples; however, the present invention is not intended to be limited to such Examples.

<Component (A): Multifunctional Benzoxazine Compound>

The following (A1) was used in the component (A).

(A1): Benzoxazine represented by the following formula (1-1-1) (3-[3-[4-(2H-1,3-benzoxazin-3(4H)-yl)phenoxy]phenyl]-3,4-di hydro-2H-1,3-benzoxazine) (3,4'-APE-BOZ) (benzoxazine equivalent (g/eq): 218, HONSHU CHEMICAL INDUSTRY CO., LTD., developed product)

[Chem. 26]

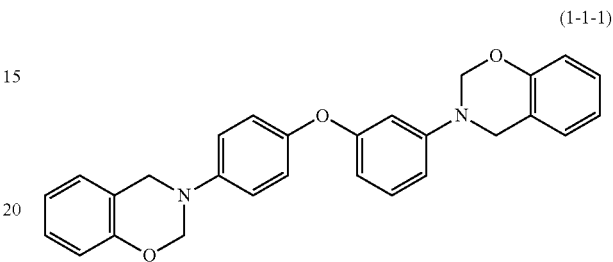

(1-1-1)

The following (CA1) was used as epoxy compounds for Comparative Examples.

(CA1): Phenol-diaminodiphenylmethane (P-d)-type benzoxazine represented by the following formula (manufactured by SHIKOKU CHEMICALS CORPORATION) (benzoxazine equivalent (g/eq): 217)

[Chem. 27]

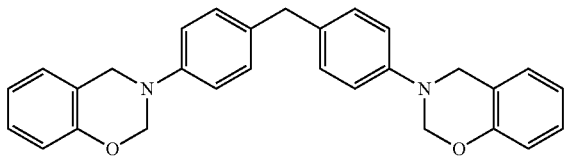

<Component (B): Epoxy Compound>

The following (B1) to (B9) were used in the component (B).

(B1) Epoxy Compound 1: Compound of Formula (5-1)

The compound (a) represented by formula (6) was synthesized according to a method described in "Shoichi Tsuchida et al., "Diels-Alder Reaction between Butadiene and Cyclopentadiene-Determination of Trimers-", Journal of the Japan Petroleum Institute, 1972, Vol. 15, Issue 3, pages 189 to 192".

Next, the reaction of formula (6) was performed as follows. A reaction vessel was charged with 23.5 kg of chloroform and 1.6 kg of the compound (a), and 4.5 kg of meta-chloroperbenzoic acid was dropped thereto with stirring at 0° C. The temperature was raised to room temperature, and the reaction was performed for 12 hours.

Next, meta-chlorobenzoic acid as a by-product was removed by filtration, and thereafter, the filtrate was washed with an aqueous 1 N sodium hydroxide solution three times, and then washed with saturated saline. After the organic layer was dried over magnesium sulfate, the magnesium sulfate was removed by filtration and the filtrate was concentrated, to obtain a crude product.

To the crude product was added 2 kg of toluene, to dissolve the crude product at room temperature. Thereto was added dropwise 6 kg of heptane for crystallization, and the resultant was aged at 5° C. for 1 hour. The resulting crystallized product was collected by filtration and washed with hexane. The product was dried under reduced pressure at 35° C. for 24 hours, to obtain 1.4 kg of a compound represented by the following formula (5-1), as a white solid.

[Chem. 28]

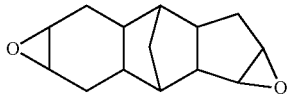

(5-1)

(B2) Epoxy Compound 2: Compound (Dicyclopentadiene Diepoxide) of Formula (5-4)

A reaction vessel was charged with 10 kg of dicyclopentadiene, 68 kg of sodium bicarbonate, 100 L of acetone and 130 L of ion exchange water, and cooled to 10° C. or lower. Thereafter, while controlling the cooling so that the temperature of the reaction liquid was kept at 30° C. or lower, 84 kg of oxone was gradually added, and the reaction was performed with stirring for 10 hours.

Next, the reaction product was extracted with 100 L of ethyl acetate twice, and the resulting organic layers were fractionated and combined. Subsequently, the combined organic layer was washed with 100 L of a mixed aqueous solution of salt and sodium thiosulfate (20% by weight of salt+20% by weight of sodium thiosulfate), and then further washed with 100 L of ion exchange water twice.

After the washed organic layer was dried over magnesium sulfate, the magnesium sulfate was removed by filtration, and the organic solvent was distilled off from the filtrate, to obtain 11 kg of a compound represented by the following formula (5-4), as a white solid.

[Chem. 29]

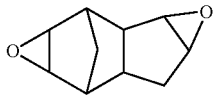

(5-4)

(B3) Epoxy compound 3: Biphenyl type epoxy compound (NC3000, having an epoxy equivalent (g/eq): 265 to 285, manufactured by NIPPON KAYAKU CO., LTD.) represented by the following formula (3-1-1):

[Chem. 30]

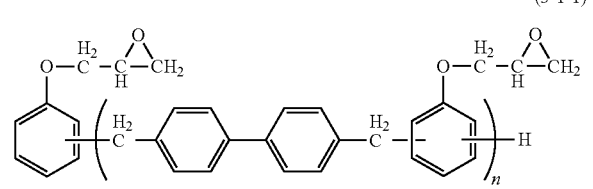

(3-1-1)

wherein in the formula (3-1-1), n represents an average value and is 3.4.

(B4) Epoxy compound 4: Epoxy compound (EPPN-501H, having an epoxy equivalent (g/eq): 162 to 172, manufactured by NIPPON KAYAKU CO., LTD.) represented by the following formula (9-1):

[Chem. 31]

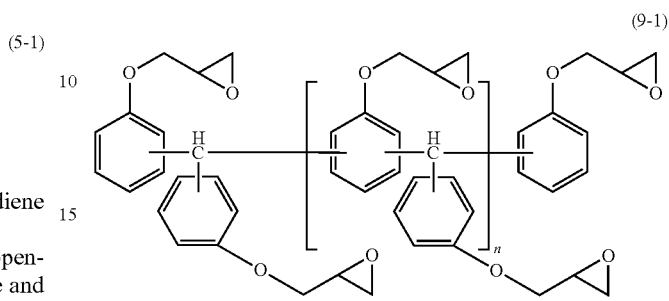

(9-1)

wherein in the formula (9-1), n represents an average value and is 1.3.

(B5) Epoxy compound 5: Naphthyleneether type epoxy compound (HP-6000, having an epoxy equivalent (g/eq): 235 to 255, manufactured by DIC CORPORATION) represented by the following formula (10-7).

[Chem. 32]

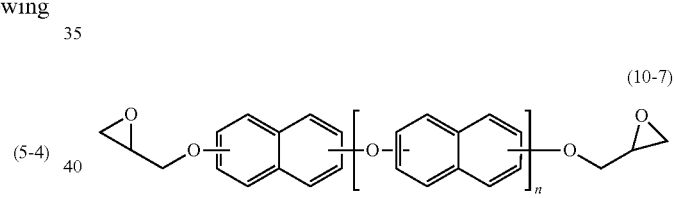

(10-7)

(The epoxy compound 5 is a mixture of a component represented by formula (10-7) wherein n is 1 and a component represented by formula (10-7) wherein n is 2).

(B6) Epoxy compound 6: Biphenyl type epoxy compound (YX4000, having an epoxy equivalent (g/eq): 180 to 192, manufactured by MITSUBISHI CHEMICAL CORPORATION) represented by the following formula (3-2-1).

[Chem. 33]

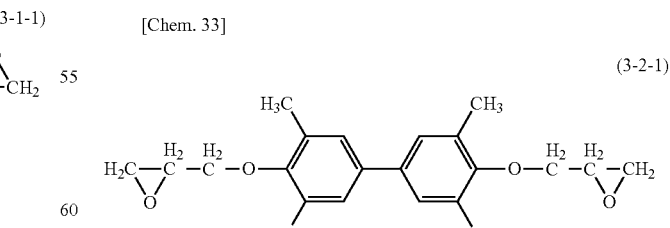

(3-2-1)

(B7) Epoxy compound 7: Epoxy compound (HP-4770, having an epoxy equivalent (g/eq): 200 to 210, manufactured by DIC CORPORATION) represented by the following formula (11):

[Chem. 34]

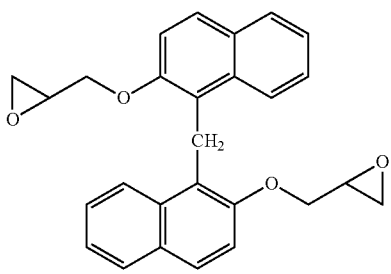
(11-1)

(B8) Epoxy compound 8: Epoxy compound (Celloxide 2021P, having an epoxy equivalent (g/eq): 128 to 145, manufactured by DAICEL CORPORATION) represented by the following formula (13-1).

[Chem. 35]

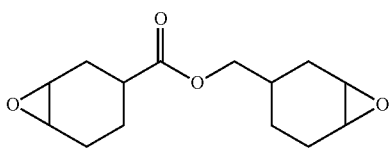
(13-1)

(B9) Epoxy compound 9: Epoxy compound (Celloxide 8010, having an epoxy equivalent (g/eq): 95 to 105 g/eq, manufactured by DAICEL CORPORATION) represented by the following formula (13-2).

[Chem. 36]

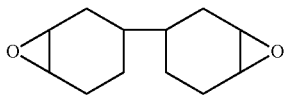
(13-2)

<Component (C): Phenol-Based Curing Agent>

The following (C1) to (C7) were used in the component (C).

(C1) Phenol-based curing agent 1: Bisphenol F represented by the following formula (12-1) (manufactured by HONSHU CHEMICAL INDUSTRY CO., LTD.)

[Chem. 37]

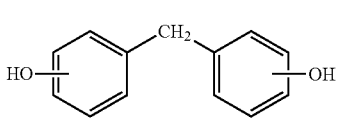
(12-1)

(C2) Phenol-based curing agent 2: Bis(4-hydroxyphenyl) sulfide (TDP) represented by the following formula (12-2) (manufactured by TOKYO CHEMICAL INDUSTRY CO., LTD.)

[Chem. 38]

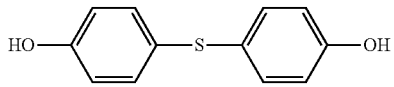
(12-2)

(C3) Phenol-based curing agent 3: 2,7-dihydroxynaphthalene represented by the following formula (12-3) (manufactured by TOKYO CHEMICAL INDUSTRY CO., LTD.)

[Chem. 39]

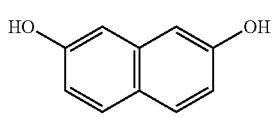
(12-3)

(C4) Phenol-based curing agent 4: Pyrogallol represented by the following formula (12-4) (manufactured by TOKYO CHEMICAL INDUSTRY CO., LTD.)

[Chem. 40]

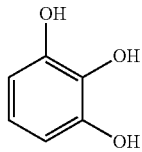
(12-4)

(C5) Phenol-based curing agent 5: Phenol novolac resin (TD-2106, having a hydroxyl group equivalent of 104, manufactured by DIC CORPORATION.)
(C6) Phenol-based curing agent 6: Phenol aralkyl resin having a biphenylene skeleton (MEHC-7851SS, having a hydroxyl group equivalent of 203 g/eq, manufactured by MEIWA PLASTIC INDUSTRIES, LTD.)
(C7) Phenol-based curing agent 7: Phenol aralkyl resin having a phenylene skeleton (MEH-7800-4S, having a hydroxyl group equivalent of 169 g/eq, manufactured by MEIWA PLASTIC INDUSTRIES, LTD.)

<Component (D): Curing Accelerator>

The following (D1) to (D4) were used in the component (D).
The following was used.
(D1) Curing accelerator 1: Triphenylphosphine (TPP) represented by the following formula (manufactured by HOKKO CHEMICAL INDUSTRY CO., LTD.)

[Chem. 41]

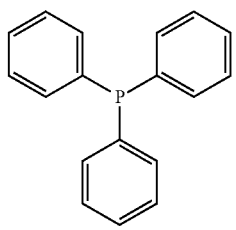

(D2) Curing accelerator 2: bis(tetrabutylphosphonium) (BTBP)-pyromellitic acid, represented by the following formula (manufactured by HOKKO CHEMICAL INDUSTRY CO., LTD.)

[Chem. 42]

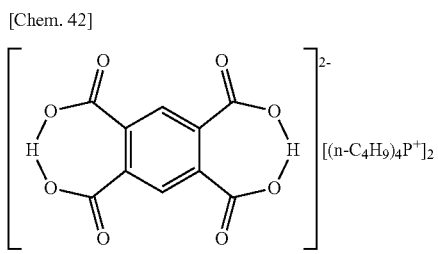

(D3) Curing accelerator 3: Tetraphenylphosphonium·tetraphenylborate (TPP-K (trademark)) represented by the following formula (manufactured by HOKKO CHEMICAL INDUSTRY CO., LTD.)

[Chem. 43]

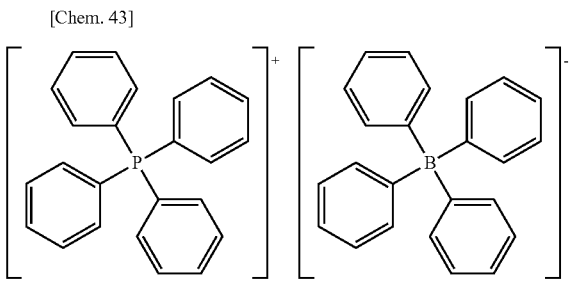

(D4) Curing accelerator 4: tetrabutylphosphonium 2,6-bis[(2-hydroxy-5-methylphenyl)methyl]-4-methylphenolate (TBP-3PC) (manufactured by HOKKO CHEMICAL INDUSTRY CO., LTD.)
<Component (E): Inorganic Filler>
A fused spherical silica (FB-820, manufactured by DENKA COMPANY LIMITED) having an average particle size D50 of 22 μm was used as the component (E).
<Other Components>
Carnauba wax (manufactured by CLARIANT JAPAN K.K.) as a release agent and carbon black (MA600, manufactured by MITSUBISHI CHEMICAL CORPORATION) as a colorant were used.

Example 1

A curable resin composition (hereinafter, simply referred to as "composition") and a cured product were prepared as follows, and the thermophysical property (reaction peak temperature) determined by differential scanning calorimetry (DSC) for evaluating the curability, and the glass transition temperature for evaluating the heat resistance were measured.

The components (A1), (B1), and (C1) were kneaded at the compounding ratio shown in Table 1 on a hot platen whose surface temperature was controlled at 100° C., under atmospheric pressure for 5 minutes, and then the resultant was cooled to room temperature to obtain a mixture. The mixture was crushed into a powder with a mortar, to obtain a composition.
<Thermophysical Property Determined by Differential Scanning Calorimetry (DSC)>
Into an aluminum pan was introduced 10 mg of the composition, and the thermophysical property of the composition was measured using a differential scanning calorimeter (DSC7020, manufactured by HITACHI HIGH-TECH SCIENCE CORPORATION) determined by differential scanning calorimetry (DSC), under a nitrogen gas stream, and under the conditions of a rate of temperature rise of 10° C./min and in a temperature range of 30° C. to 300° C. The highest point in the graph was defined as the reaction peak temperature. When a reaction peak temperature is too high, a reaction may not proceed sufficiently at a predetermined curing temperature, resulting in a poor reactivity. The results are shown in Table 1. FIG. 1 shows the reaction peak temperature in a typical measured result (one example) of DSC.
<Glass Transition Temperature; Tg>
Into an aluminum pan for use in DSC was weighed about 10 mg of the composition, and the composition was heated in an oven at 200° C. for 4 hours, to obtain a cured product. The Tg of the resulting cured product was measured by DSC, under the following conditions. The results are shown in Table 1.
Apparatus: X-DSC-7000 (manufactured by HITACHI HIGH-TECH SCIENCE CORPORATION)
Measurement conditions: flow rate of $N_2$; 20 mL/min, rate of temperature rise; 20° C./min Examples 2 to 44

Each composition of the Examples was prepared in the same manner as in Example 1, except that the compounding ratio of the respective components was varied as shown in Table 1. The thermophysical property (the reaction peak temperature) determined by DSC, and the heat resistance (glass transition temperature) of each composition were measured in the same manner as in Example 1. The results are shown in Table 1.

Comparative Examples 1 to 8

Each composition of Comparative Examples was prepared in the same manner as in Example 1, except that the compounding ratio the respective components was varied as shown in Table 2. The thermophysical property (the reaction peak temperature) determined by DSC, and the heat resistance (glass transition temperature) of each composition were measured in the same manner as in Example 1. The results are shown in Table 2.

TABLE 1

| | | | Examples | | | | | | | | | | | | | | |
|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 |
| Components (parts by mass) | Multi-functional benzoxazine compound | (A1) | 52.1 | 58.5 | 61.5 | 50.7 | 42.8 | 57.9 | 51.9 | 53.1 | 54.8 | 55.3 | 54.7 | 57.5 | 33.2 | 43.5 | 35.5 |
| | | (CA1) | | | | | | | | | | | | | | | |
| | Epoxy compound | (B1) | 37.5 | 35.7 | 35.0 | 37.8 | 40.1 | 30.5 | 39.2 | 39.0 | 34.2 | 33.6 | 34.4 | | | | |
| | | (B2) | | | | | | | | | | | | 31.1 | | | |
| | | (B3) | | | | | | | | | | | | | 60.1 | | |

TABLE 1-continued

| | | | | | | | | | | | | | | | | | |
|---|---|---|---|---|---|---|---|---|---|---|---|---|---|---|---|---|---|
| | | (B4) | | | | | | | | | | | | | | 47.8 | |
| | | (B5) | | | | | | | | | | | | | | | 57.3 |
| | | (B6) | | | | | | | | | | | | | | | |
| | | (B7) | | | | | | | | | | | | | | | |
| | | (B8) | | | | | | | | | | | | | | | |
| | | (B9) | | | | | | | | | | | | | | | |
| Curing agent | | (C1) | 10.4 | 5.8 | 3.7 | 11.4 | 17.1 | | | | | | | 11.5 | 6.6 | 8.7 | 7.1 |
| | | (C2) | | | | | | 11.6 | | | | | | | | | |
| | | (C3) | | | | | | | 9.3 | | | | | | | | |
| | | (C4) | | | | | | | | 7.4 | | | | | | | |
| | | (C5) | | | | | | | | | 11.0 | | | | | | |
| | | (C6) | | | | | | | | | | 11.1 | | | | | |
| | | (C7) | | | | | | | | | | | 10.9 | | | | |
| Curing accelerator | | (D1) | | | | | | | | | | | | | | | |
| | | (D2) | | | | | | | | | | | | | | | |
| | | (D3) | | | | | | | | | | | | | | | |
| | | (D4) | | | | | | | | | | | | | | | |
| Number of epoxy groups/(Number of benzoxazine rings + Number of hydroxyl groups) | | | 1.0 | 1.0 | 1.0 | 1.0 | 1.0 | 0.8 | 1.0 | 0.9 | 0.9 | 1.0 | 1.0 | 1.0 | 1.0 | 1.0 | 1.0 |
| Number of benzoxazine rings/Number of hydroxyl groups | | | 2.3 | 4.6 | 7.6 | 2.0 | 1.1 | 2.5 | 2.0 | 1.4 | 2.4 | 4.6 | 3.9 | 2.3 | 2.3 | 2.3 | 2.3 |
| Performance evaluation | Reaction peak temperature | [° C.] | 237 | 246 | 251 | 239 | 224 | 232 | 235 | 230 | 237 | 246 | 247 | 228 | 250 | 242 | 251 |
| | Glass transition temperature | [° C.] | 225 | 231 | 234 | 223 | 212 | 230 | 218 | 224 | 231 | 218 | 222 | 212 | 210 | 237 | 216 |

| | | | Examples | | | | | | | | | | | | | | |
|---|---|---|---|---|---|---|---|---|---|---|---|---|---|---|---|---|---|
| | | | 16 | 17 | 18 | 19 | 20 | 21 | 22 | 23 | 24 | 25 | 26 | 27 | 28 | 29 | 30 |
| Components (parts by mass) | Multi-functional benzoxazine compound | (A1) (CA1) | 40.3 | 39.2 | 47.7 | 53.8 | 55.0 | 49.2 | 52.0 | 48.5 | 51.6 | 50.9 | 45.2 | 47.1 | 46.8 | 56.9 | 56.9 |
| | Epoxy compound | (B1) | | | | | 17.0 | 20.5 | 18.8 | 20.2 | 19.0 | 19.4 | 22.9 | 21.7 | 21.9 | 30.7 | 30.7 |
| | | (B2) | | | | | 17.0 | | | | | | | | | | |
| | | (B3) | | | | | | 20.5 | | | | | | | | | |
| | | (B4) | | | | | | | 18.8 | 20.2 | 19.0 | 19.4 | | | | | |
| | | (B5) | | | | | | | | | | | 20.0 | | | | |
| | | (B6) | 51.7 | | | | | | | | | | | 21.7 | | | |
| | | (B7) | | 52.9 | | | | | | | | | | | 21.9 | | |
| | | (B8) | | | 42.8 | | | | | | | | | | | | |
| | | (B9) | | | | 35.4 | | | | | | | | | | | |
| | Curing agent | (C1) | 8.1 | 7.8 | 9.5 | 10.8 | 11.0 | 9.8 | 10.4 | | | | 9.0 | 9.4 | 9.4 | 11.4 | 11.4 |
| | | (C2) | | | | | | | | | | | | | | | |
| | | (C3) | | | | | | | | | | | | | | | |
| | | (C4) | | | | | | | | | | | | | | | |
| | | (C5) | | | | | | | | 9.7 | | | | | | | |
| | | (C6) | | | | | | | | | 10.3 | | | | | | |
| | | (C7) | | | | | | | | | | 10.2 | | | | | |
| | Curing accelerator | (D1) | | | | | | | | | | | | | | 1.0 | |
| | | (D2) | | | | | | | | | | | | | | | 1.0 |
| | | (D3) | | | | | | | | | | | | | | | |
| | | (D4) | | | | | | | | | | | | | | | |
| Number of epoxy groups/(Number of benzoxazine rings + Number of hydroxyl groups) | | | 1.0 | 1.0 | 1.0 | 1.0 | 1.0 | 0.8 | 0.8 | 1.0 | 1.0 | 1.0 | 1.0 | 1.0 | 1.0 | 0.8 | 0.8 |
| Number of benzoxazine rings/Number of hydroxyl groups | | | 2.3 | 2.3 | 2.3 | 2.3 | 2.3 | 2.3 | 2.3 | 2.4 | 4.7 | 4.5 | 2.3 | 2.3 | 2.3 | 2.3 | 2.3 |
| Performance evaluation | Reaction peak temperature | [° C.] | 249 | 248 | 246 | 238 | 235 | 242 | 241 | 242 | 252 | 253 | 243 | 242 | 244 | 217 | 223 |
| | Glass transition temperature | [° C.] | 215 | 216 | 239 | 237 | 218 | 215 | 235 | 228 | 225 | 226 | 219 | 213 | 211 | 226 | 231 |

TABLE 1-continued

|  |  |  | Examples |  |  |  |  |  |  |  |  |  |  |  |  |  |
|---|---|---|---|---|---|---|---|---|---|---|---|---|---|---|---|---|
|  |  |  | 31 | 32 | 33 | 34 | 35 | 36 | 37 | 38 | 39 | 40 | 41 | 42 | 43 | 44 |
| Components (parts by mass) | Multi-functional benzoxazine compound | (A1) (CA1) | 56.9 | 54.2 | 52.3 | 54.5 | 48.7 | 51.4 | 47.9 | 51.0 | 50.3 | 58.7 | 45.3 | 40.1 | 63.5 | 60.6 |
|  | Epoxy compound | (B1) | 30.7 | 33.9 | 37.2 | 16.8 | 20.3 | 18.6 | 20.6 | 18.8 | 19.2 | 29.5 | 45.6 | 51.9 | 22.8 | 13.0 |
|  |  | (B2) |  |  |  | 16.8 |  |  |  |  |  |  |  |  |  |  |
|  |  | (B3) |  |  |  |  | 20.3 |  |  |  |  |  |  |  |  |  |
|  |  | (B4) |  |  |  |  |  | 18.6 | 20.6 | 18.8 | 19.2 |  |  |  |  | 13.0 |
|  |  | (B5) |  |  |  |  |  |  |  |  |  |  |  |  |  |  |
|  |  | (B6) |  |  |  |  |  |  |  |  |  |  |  |  |  |  |
|  |  | (B7) |  |  |  |  |  |  |  |  |  |  |  |  |  |  |
|  |  | (B8) |  |  |  |  |  |  |  |  |  |  |  |  |  |  |
|  |  | (B9) |  |  |  |  |  |  |  |  |  |  |  |  |  |  |
|  | Curing agent | (C1) | 11.4 |  |  | 10.9 | 9.7 | 10.3 |  |  |  | 11.7 | 9.1 | 8.0 | 12.7 | 12.0 |
|  |  | (C2) |  |  |  |  |  |  |  |  |  |  |  |  |  |  |
|  |  | (C3) |  |  |  |  |  |  |  |  |  |  |  |  |  |  |
|  |  | (C4) |  |  |  |  |  |  |  |  |  |  |  |  |  |  |
|  |  | (C5) |  | 10.8 | 10.5 |  |  |  | 9.6 |  |  |  |  |  |  |  |
|  |  | (C6) |  |  |  |  |  |  |  | 10.2 |  |  |  |  |  |  |
|  |  | (C7) |  |  |  |  |  |  |  |  | 10.1 |  |  |  |  |  |
|  | Curing accelerator | (D1) |  |  |  |  |  |  |  |  |  |  |  |  |  |  |
|  |  | (D2) |  |  |  |  |  |  |  |  |  |  |  |  |  |  |
|  |  | (D3) | 1.0 | 1.0 |  | 1.0 | 1.0 | 1.0 | 1.0 | 1.0 | 1.0 |  | 1.0 |  | 1.0 | 1.0 |
|  |  | (D4) |  |  | 1.0 |  |  |  |  |  |  |  |  |  |  |  |
| Number of epoxy groups/(Number of benzoxazine rings + Number of hydroxyl groups) |  |  | 0.8 | 0.9 | 1.0 | 1.0 | 0.8 | 0.8 | 1.0 | 1.0 | 1.0 | 0.7 | 1.4 | 1.8 | 0.5 | 0.5 |
| Number of benzoxazine rings/Number of hydroxyl groups |  |  | 2.3 | 2.4 | 2.4 | 2.3 | 2.3 | 2.3 | 2.4 | 4.6 | 4.5 | 2.3 | 2.3 | 2.3 | 2.3 | 2.3 |
| Performance evaluation | Reaction peak temperature | [° C.] | 206 | 231 | 227 | 221 | 224 | 224 | 234 | 245 | 243 | 228 | 241 | 247 | 221 | 217 |
|  | Glass transition temperature | [° C.] | 215 | 236 | 242 | 211 | 223 | 234 | 227 | 223 | 225 | 221 | 222 | 212 | 219 | 234 |

TABLE 2

|  |  |  | Comparative Examples |  |  |  |  |  |  |  |
|---|---|---|---|---|---|---|---|---|---|---|
|  |  |  | 1 | 2 | 3 | 4 | 5 | 6 | 7 | 8 |
| Components (parts by mass) | Multifunctional benzoxazine compound | (A1) |  |  | 66.6 | 66.0 | 64.0 | 37.7 | 67.2 | 37.9 |
|  |  | (CA1) | 52.1 | 51.5 |  |  |  |  |  |  |
|  | Epoxy compound | (B1) | 37.5 | 37.2 | 33.4 | 33.0 | 34.1 | 41.5 | 19.3 | 54.5 |
|  |  | (B2) |  |  |  |  |  |  |  |  |
|  |  | (B3) |  |  |  |  |  |  |  |  |
|  |  | (B4) |  |  |  |  |  |  |  |  |
|  |  | (B5) |  |  |  |  |  |  |  |  |
|  |  | (B6) |  |  |  |  |  |  |  |  |
|  |  | (B7) |  |  |  |  |  |  |  |  |
|  | Curing agent | (C1) | 10.4 | 10.3 |  |  | 1.9 | 20.8 | 13.4 | 7.6 |
|  |  | (C2) |  |  |  |  |  |  |  |  |
|  |  | (C3) |  |  |  |  |  |  |  |  |
|  |  | (C4) |  |  |  |  |  |  |  |  |
|  |  | (C5) |  |  |  |  |  |  |  |  |
|  | Curing accelerator | (D1) |  |  |  |  |  |  |  |  |
|  |  | (D2) |  |  |  |  |  |  |  |  |
|  |  | (D3) |  | 1.0 |  | 1.0 |  |  |  |  |
| Number of epoxy groups/(Number of benzoxazine rings + Number of hydroxyl groups) |  |  | 1.0 | 1.0 | 1.0 | 1.0 | 1.0 | 1.0 | 0.4 | 2.0 |
| Number of benzoxazine rings/Number of hydroxyl groups |  |  | 2.3 | 2.3 | — | — | 15.5 | 0.8 | 2.3 | 2.3 |

TABLE 2-continued

|  |  |  | Comparative Examples | | | | | | | |
|---|---|---|---|---|---|---|---|---|---|---|
|  |  |  | 1 | 2 | 3 | 4 | 5 | 6 | 7 | 8 |
| Performance evaluation | Reaction peak temperature | [° C.] | 242 | 229 | 266 | 269 | 263 | 222 | 224 | 249 |
|  | Glass transition temperature | [° C.] | 195 | 205 | 235 | 236 | 244 | 198 | 206 | 203 |

In each Example, the reaction peak temperature determined by DSC of the curable resin composition is 255° C. or lower, thus the curable resin composition is excellent in curability at low temperature. Furthermore, the cured product of the curable resin composition had a Tg of 210° C. or higher, exhibiting high heat resistance. On the other hand, the cured product obtained by curing the curable resin compositions in Comparative Examples 1, 2 and 6 to 8 were low in Tg and inferior in heat resistance. Furthermore, in Comparative Examples 3 to 5, the curable resin composition had a reaction peak temperature which was higher than 255° C., and thus was inferior in curability at low temperature. In addition, the reaction peak temperature in Example 3, in which the number of benzoxazine rings/the number of hydroxyl groups is 7.6, is lower than the reaction peak temperature in Comparative Example 5, in which the components are the same as in Example 3 and the number of benzoxazine rings/the number of hydroxyl groups is 15.5. The glass transition temperature in Example 5, in which the number of benzoxazine rings/the number of hydroxyl groups is 1.1, is higher than the glass transition temperature in Comparative Example 6, in which the components are the same as in Example 5 and the number of benzoxazine rings/the number of hydroxyl groups is 0.8. The glass transition temperature in Example 40, in which the ratio of the number of functional groups (the number of epoxy groups/(the number of benzoxazine rings+the number of hydroxyl groups)) is 0.7, is 10° C. or higher than the glass transition temperature in Comparative Example 7, in which the components are the same as in Example 40 and the ratio of the number of functional groups is 0.4. The glass transition temperature in Example 42, in which the ratio of the number of functional groups (the number of epoxy groups/(the number of benzoxazine rings+the number of hydroxyl groups)) is 1.8, is higher than the glass transition temperature in Comparative Example 8, in which the components are the same as in Example 42 and the ratio of the number of functional groups is 2.0.

The above-mentioned results have revealed that a curable resin composition according to an embodiment of the present invention is excellent in curability at low temperature, and a cured product of the composition has achieved high heat resistance.

Example 45

A curable resin composition (hereinafter, simply referred to as "composition") and a cured product were prepared as follows, and the thermophysical property (the reaction peak temperature) determined by differential scanning calorimetry (DSC) for evaluating the curability, and the glass transition temperature for evaluating the heat resistance were measured.

The components (A1), (B1), (C1), (D1), (E), carnauba wax, and carbon black were kneaded, at the compounding ratio shown in Table 3, using a heat roll kneader (BR-150HCV, AIMEX CO., Ltd.) including two rolls having surface temperatures of 90° C. and 100° C., respectively, under atmospheric pressure for 10 minutes, and then the resultant was cooled to room temperature to obtain a mixture. The mixture was crushed into a powder with Mini Speed Mill MS-09 (manufactured by LABONECT CO., Ltd) so that packing into a mold can be favorably performed, thereby obtaining a composition.

<Glass Transition Temperature; Tg>

A transfer molding machine was used to cure the composition prepared, under the conditions of a mold temperature of 200° C., an injection pressure of 4 MPa and a curing time of 3 minutes, and the resultant was subjected to heating as a post-curing treatment in an oven at 200° C. for 4 hours, thereby producing a cured product having a size of 3 mm vertical×3 mm horizontal×15 mm length. The cured product was cut into a test piece having a size of 3 mm vertical×3 mm horizontal×2 mm length, and the test piece was used to measure Tg by DSC under the following conditions. The results are shown in Table 3.

Apparatus: X-DSC-7000 (manufactured by HITACHI HIGH-TECH SCIENCE CORPORATION)

Measurement conditions: flow rate of $N_2$; 20 mL/min, rate of temperature rise; 20° C./min <Thermophysical Property Determined by Differential Scanning Calorimetry (DSC)>

The thermophysical property determined by DSC of composition of Example 45 was measured in the same manner as in Example 1. The results are shown in Table 3.

Examples 46 to 49

Each composition of Examples was prepared in the same manner as in Example 45, except that the compounding ratio of the respective components was varied as shown in Table 3. The thermophysical property (the reaction peak temperature) determined by DSC, and the heat resistance (glass transition temperature) of each composition were measured in the same manner as in Example 45. The results are shown in Table 3.

Comparative Example 9

The composition of Comparative Example 9 was prepared in the same manner as in Example 45, except that the compounding ratio of the respective components was varied as shown in Table 3. The thermophysical property (the reaction peak temperature) determined by DSC, and the heat resistance (glass transition temperature) of the composition of Comparative Examples 9 were measured in the same manner as in Example 45. The results are shown in Table 3.

TABLE 3

| | | | Example | | | | | Comparative Examples |
|---|---|---|---|---|---|---|---|---|
| | | | 45 | 46 | 47 | 48 | 49 | 9 |
| Components (parts by mass) | Multifunctional benzoxazine compound | (A1) (CA1) | 7.2 | 7.2 | 8.0 | 6.2 | 6.7 | 6.2 |
| | Epoxy compound | (B1) | 5.2 | 5.2 | | 3.2 | 2.9 | 3.2 |
| | | (B2) | | | 4.3 | | | |
| | | (B3) | | | | 3.2 | | 3.2 |
| | | (B4) | | | | | 2.9 | |
| | Curing agent | (C1) | 1.4 | 1.4 | 1.6 | 1.2 | 1.3 | 1.2 |
| | Curing accelerator | (D1) | 0.5 | | | | | |
| | | (D3) | | 0.5 | 0.5 | 0.5 | 0.5 | 0.5 |
| | Inorganic filler | (E) | 85 | 85 | 85 | 85 | 85 | 85 |
| | Carnauba wax (release agent) | — | 0.3 | 0.3 | 0.3 | 0.3 | 0.3 | 0.3 |
| | Carbon black (colorant) | — | 0.3 | 0.3 | 0.3 | 0.3 | 0.3 | 0.3 |
| Number of epoxy groups/(Number of benzoxazine rings + Number of hydroxyl groups) | | | 1.0 | 1.0 | 1.0 | 1.0 | 1.0 | 1.0 |
| Number of benzoxazine rings/Number of hydroxyl groups | | | 2.4 | 2.4 | 2.3 | 2.4 | 2.4 | 2.4 |
| Performance evaluation | Glass transition temperature | [° C.] | 234 | 236 | 230 | 216 | 232 | 205 |
| | Reaction peak temperature | [° C.] | 217 | 206 | 230 | 222 | 224 | 234 |

In each Example, the Tg of the cured product of the curable resin composition is 215° C. or more, exhibiting high heat resistance. On the other hand, the cured product obtained by curing the curable resin composition of Comparative Example 9 was low in Tg and inferior in heat resistance. Furthermore, the glass transition temperature in Example 48 is 10° C. or higher than the glass transition temperature in Comparative Example 9, in which the components other than the benzoxazine are the same as in Example 48.

The invention claimed is:

1. A curable resin composition comprising:
   (A) an asymmetric benzoxazine compound represented by a structure of formula (1),
   (B) an epoxy compound, and
   (C) a phenol-based curing agent,
   wherein
   a number of epoxy groups in the epoxy compound (B), a number of benzoxazine rings in the benzoxazine compound (A), and a number of hydroxyl groups in the phenol-based curing agent (C) satisfy the following formula (2),
   a ratio of the number of benzoxazine rings in the benzoxazine compound (A) to the number of hydroxyl groups in the phenol-based curing agent (C) is 1.1 to 7.6,
   formula (1) is

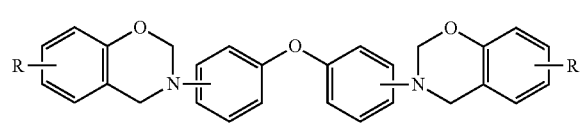

(1)

wherein in the formula (1), each R independently represents hydrogen, a linear alkyl group having 1 to 12 carbon atoms, a cyclic alkyl group having 3 to 8 carbon atoms, or an aryl group having 6 to 14 carbon atoms, where the aryl group optionally has halogen or a linear alkyl group having 1 to 12 carbon atoms, as a substituent; each R may be independently bound to any position of the benzoxazine ring; and each benzoxazine ring may be independently bound to any position of the benzene ring, and formula (2) is Number of epoxy groups/(Number of benzoxazine rings+Number of hydroxyl groups)=0.5 to 1.8   (2).

2. The curable resin composition according to claim 1, wherein the epoxy compound (B) is at least one selected from the group consisting of an epoxy compound having at least one norbornane structure and at least two epoxy groups, a biphenyl type epoxy compound, a trisphenolmethane type epoxy compound, a naphthalene type epoxy compound, a novolac type epoxy compound, and an epoxy compound having a cyclohexene oxide group.

3. The curable resin composition according to claim 1, further comprising (D) a curing accelerator.

4. The curable resin composition according to claim 1, further comprising (E) an inorganic filler.

5. A cured product obtained by curing the curable resin composition according to claim 1.

6. A semiconductor device, wherein a semiconductor element is disposed in a cured product obtained by curing the curable resin composition according to claim 1.

7. A method of producing the curable resin composition according to claim 1, the method comprising the steps of:
   mixing
   (A) an asymmetric benzoxazine compound represented by a structure of formula (1),
   (B) an epoxy compound, and
   (C) a phenol-based curing agent,
   to obtain a mixture; and
   processing the mixture into a powdery, pelletized, or granular curable resin composition.

8. The method according to claim 7, wherein the epoxy compound (B) is at least one selected from the group consisting of an epoxy compound having at least one norbornane structure and at least two epoxy groups, a biphenyl type epoxy compound, a trisphenolmethane type epoxy compound, a naphthalene type epoxy compound, a novolac type epoxy compound, and an epoxy compound having a cyclohexene oxide group.

9. The method according to claim 7, wherein the step of obtaining a mixture comprises further mixing (D) a curing accelerator and/or (E) an inorganic filler to obtain the mixture.

10. A method of producing a cured product, the method comprising a step of heating the curable resin composition produced by the method according to claim 7, at 150 to 300° C. for 20 seconds to 4 hours, for curing.

11. The curable resin composition according to claim 2, further comprising (D) a curing accelerator.

12. The curable resin composition according to claim 11, further comprising (E) an inorganic filler.

13. A cured product obtained by curing the curable resin composition according to claim 12.

14. A semiconductor device, wherein a semiconductor element is disposed in a cured product obtained by curing the curable resin composition according to claim 12.

15. The method according to claim 8, wherein the step of obtaining a mixture comprises further mixing (D) a curing accelerator and/or (E) an inorganic filler to obtain the mixture.

16. A method of producing a cured product, the method comprising a step of heating the curable resin composition produced by the method according to claim 8, at 150 to 300° C. for 20 seconds to 4 hours, for curing.

17. A method of producing a cured product, the method comprising a step of heating the curable resin composition produced by the method according to claim 9, at 150 to 300° C. for 20 seconds to 4 hours, for curing.

18. A method of producing a cured product, the method comprising a step of heating the curable resin composition produced by the method according to claim 15, at 150 to 300° C. for 20 seconds to 4 hours, for curing.

19. The curable resin composition according to claim 1, wherein the asymmetric benzoxazine compound is of formula (1-1):

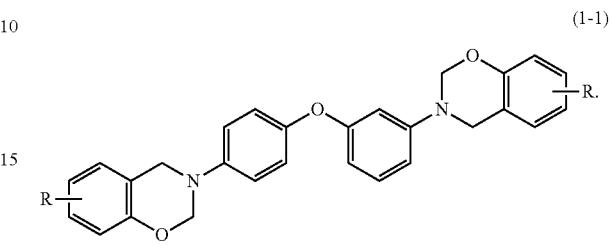

(1-1)

20. The method according to claim 7, wherein the asymmetric benzoxazine compound is of formula (1-1):

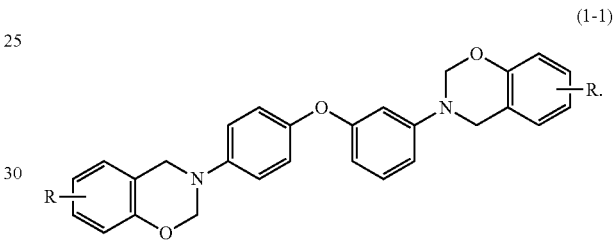

(1-1)

* * * * *